(12) United States Patent
Shin et al.

(10) Patent No.: US 10,930,671 B2
(45) Date of Patent: Feb. 23, 2021

(54) VERTICAL MEMORY DEVICES

(71) Applicant: SAMSUNG ELECTRONICS CO., LTD., Suwon-si (KR)

(72) Inventors: Seung-Jun Shin, Yongin-si (KR); Bong-Hyun Choi, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/514,548

(22) Filed: Jul. 17, 2019

(65) Prior Publication Data
US 2020/0119043 A1    Apr. 16, 2020

(30) Foreign Application Priority Data

Oct. 12, 2018 (KR) .................. 10-2018-0121516

(51) Int. Cl.
*H01L 27/11582* (2017.01)
*H01L 27/11556* (2017.01)
*H01L 29/423* (2006.01)
*H01L 29/10* (2006.01)
*H01L 27/1157* (2017.01)

(52) U.S. Cl.
CPC .... *H01L 27/11582* (2013.01); *H01L 27/1157* (2013.01); *H01L 27/11556* (2013.01); *H01L 29/105* (2013.01); *H01L 29/42356* (2013.01)

(58) Field of Classification Search
CPC ......... H01L 27/11582; H01L 27/11556; H01L 27/1157; H01L 29/105; H01L 29/42356; H01L 2924/14511; H01L 27/115–11597; G11C 16/00–349
See application file for complete search history.

(56) References Cited

U.S. PATENT DOCUMENTS

| | | | |
|---|---|---|---|
| 9,368,216 B2 | 6/2016 | Tanzawa | |
| 9,558,945 B2 | 1/2017 | Fukuzumi et al. | |
| 9,741,733 B2 | 8/2017 | Lim et al. | |
| 9,818,693 B2 | 11/2017 | Toyama et al. | |
| 9,825,047 B2 | 11/2017 | Cho et al. | |
| 2012/0119283 A1* | 5/2012 | Lee | H01L 27/11565 257/316 |
| 2016/0351672 A1 | 12/2016 | Eom | |
| 2017/0200676 A1* | 7/2017 | Jeong | H01L 21/76816 |
| 2017/0250339 A1* | 8/2017 | Sim | H01L 27/2481 |
| 2018/0247955 A1* | 8/2018 | Iida | H01L 27/11582 |

* cited by examiner

*Primary Examiner* — Shahed Ahmed
(74) *Attorney, Agent, or Firm* — F. Chau & Associates, LLC

(57) ABSTRACT

A vertical memory device includes a substrate having a cell array region and a staircase region. Gate electrodes are spaced apart from each other in first and third directions. A channel extends through the gate electrodes in the first direction on the cell array region. Each of the gate electrodes extends in a second direction. End portions in the second direction of one or more of the gate electrodes form a first stair structure on the staircase region of the substrate. The first stair structure includes first steps, a second step, and a third step sequentially disposed in the third direction. Each of the first steps has a first length, the second step has a second length greater than the first length, and the third step has a third length greater than the second length.

20 Claims, 45 Drawing Sheets

FIG. 1
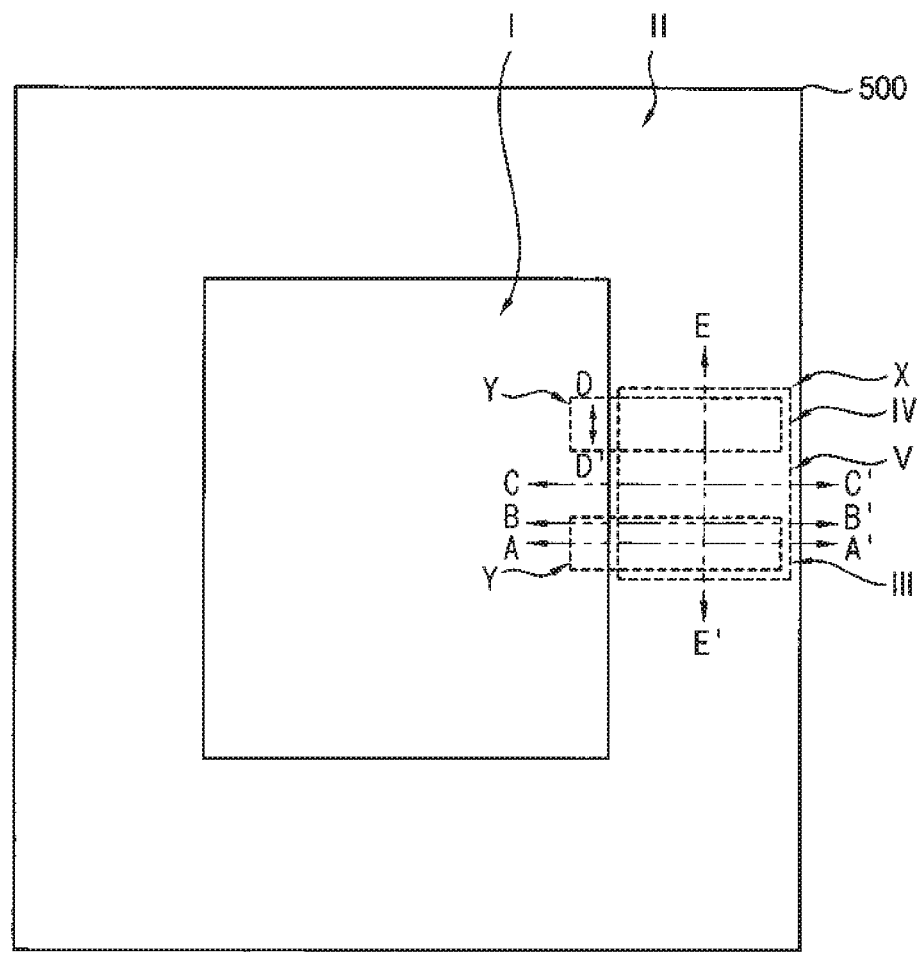
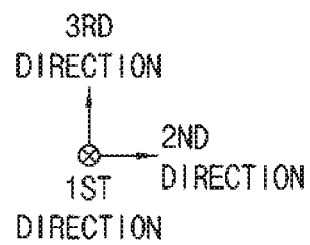

FIG. 13
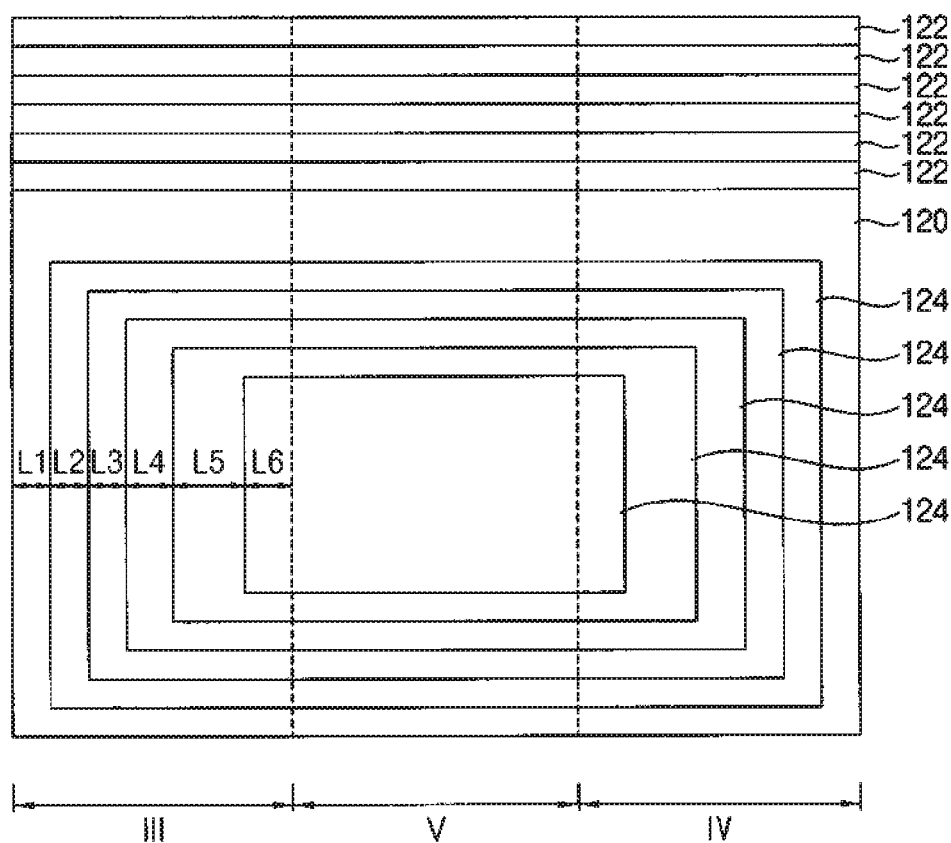
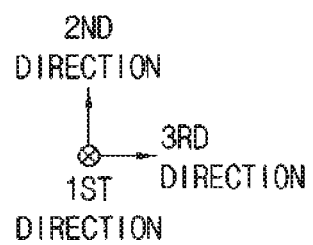

1ST DIRECTION
2ND DIRECTION
3RD DIRECTION

FIG. 20
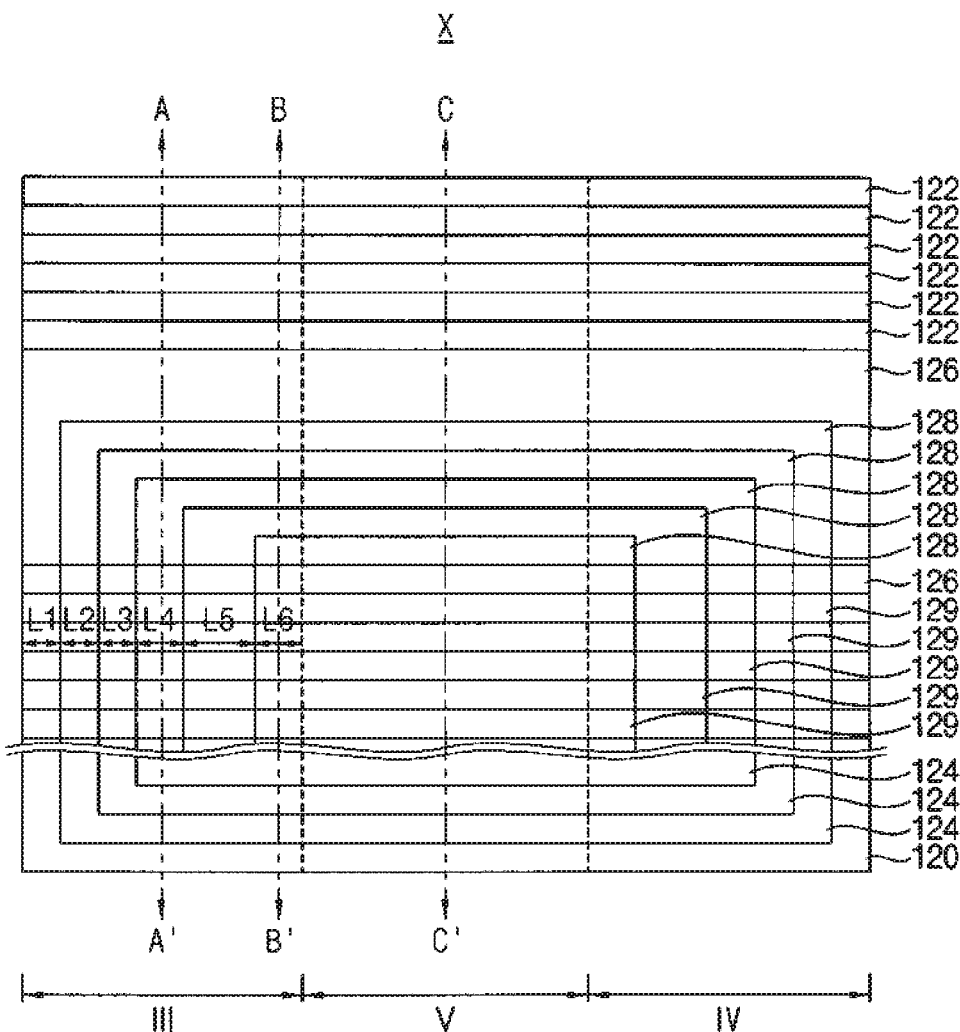
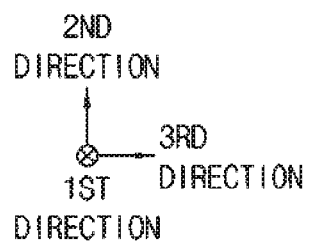

FIG. 24
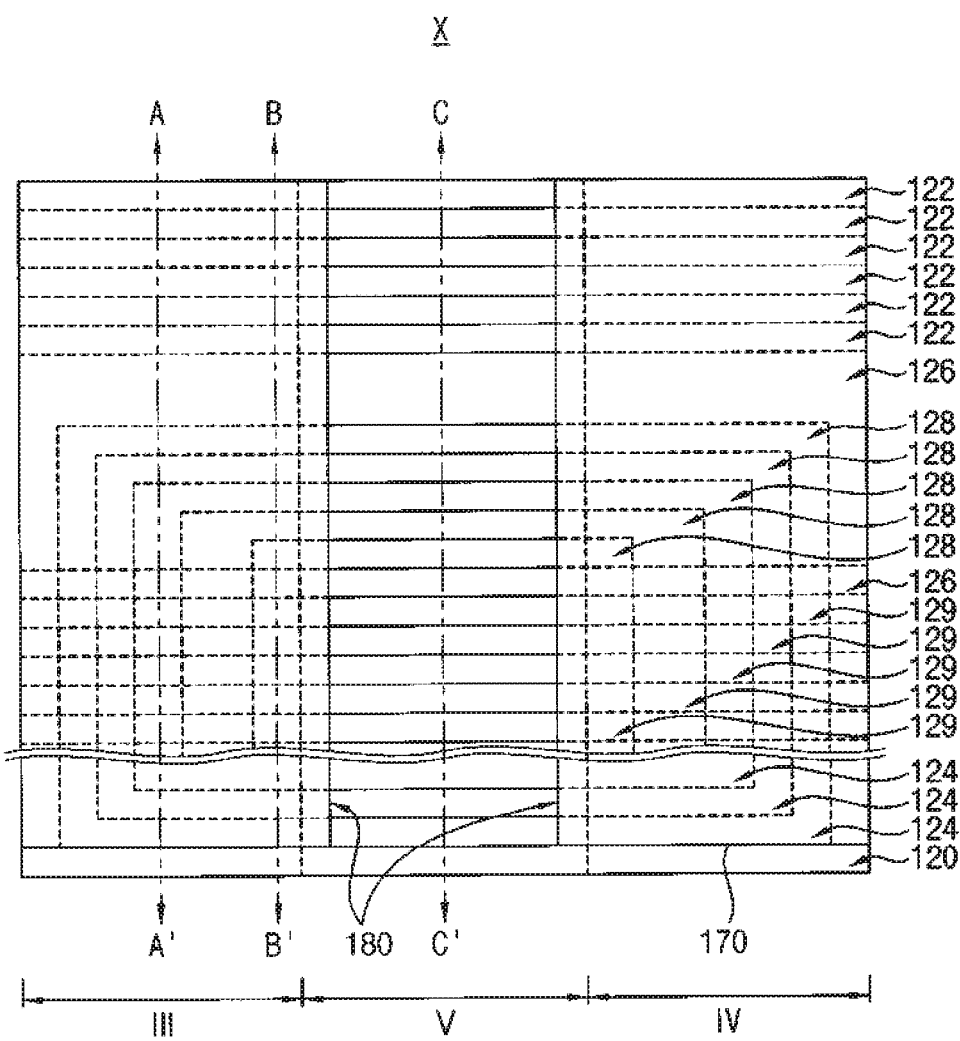
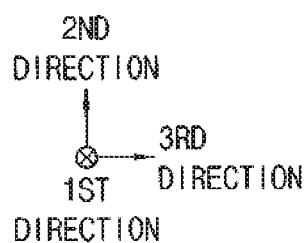

FIG. 34
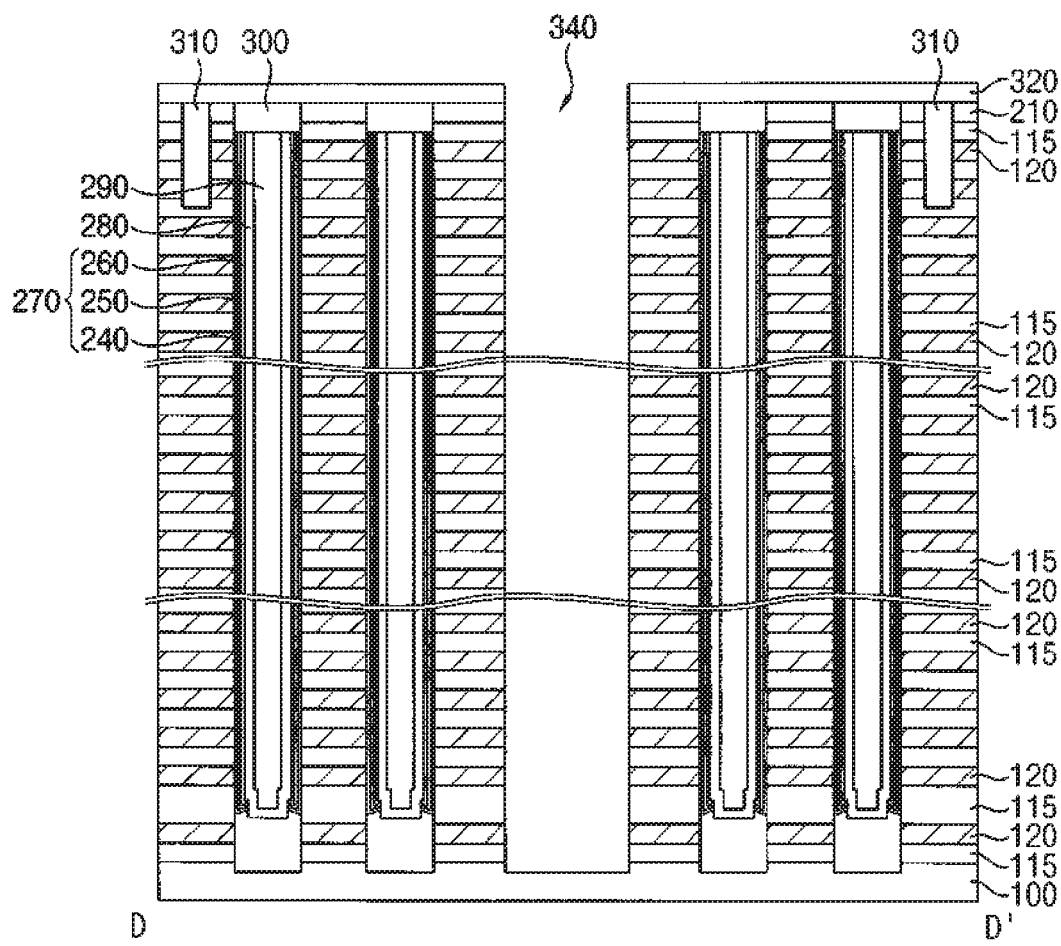
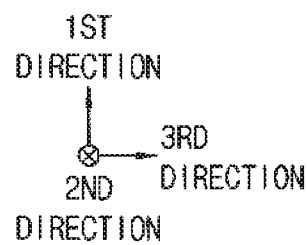

FIG. 35
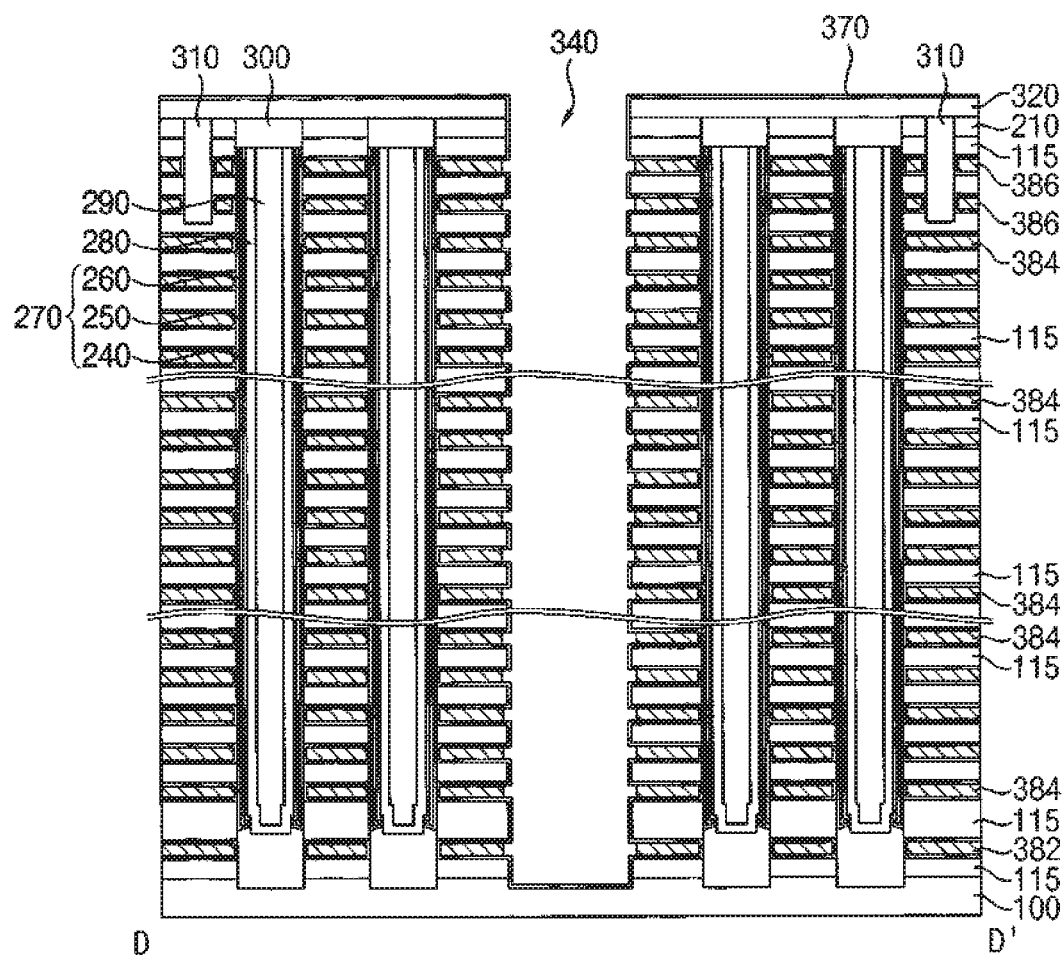
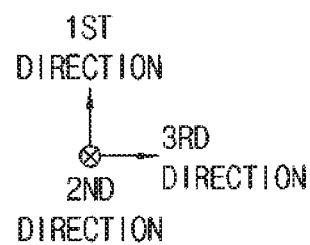

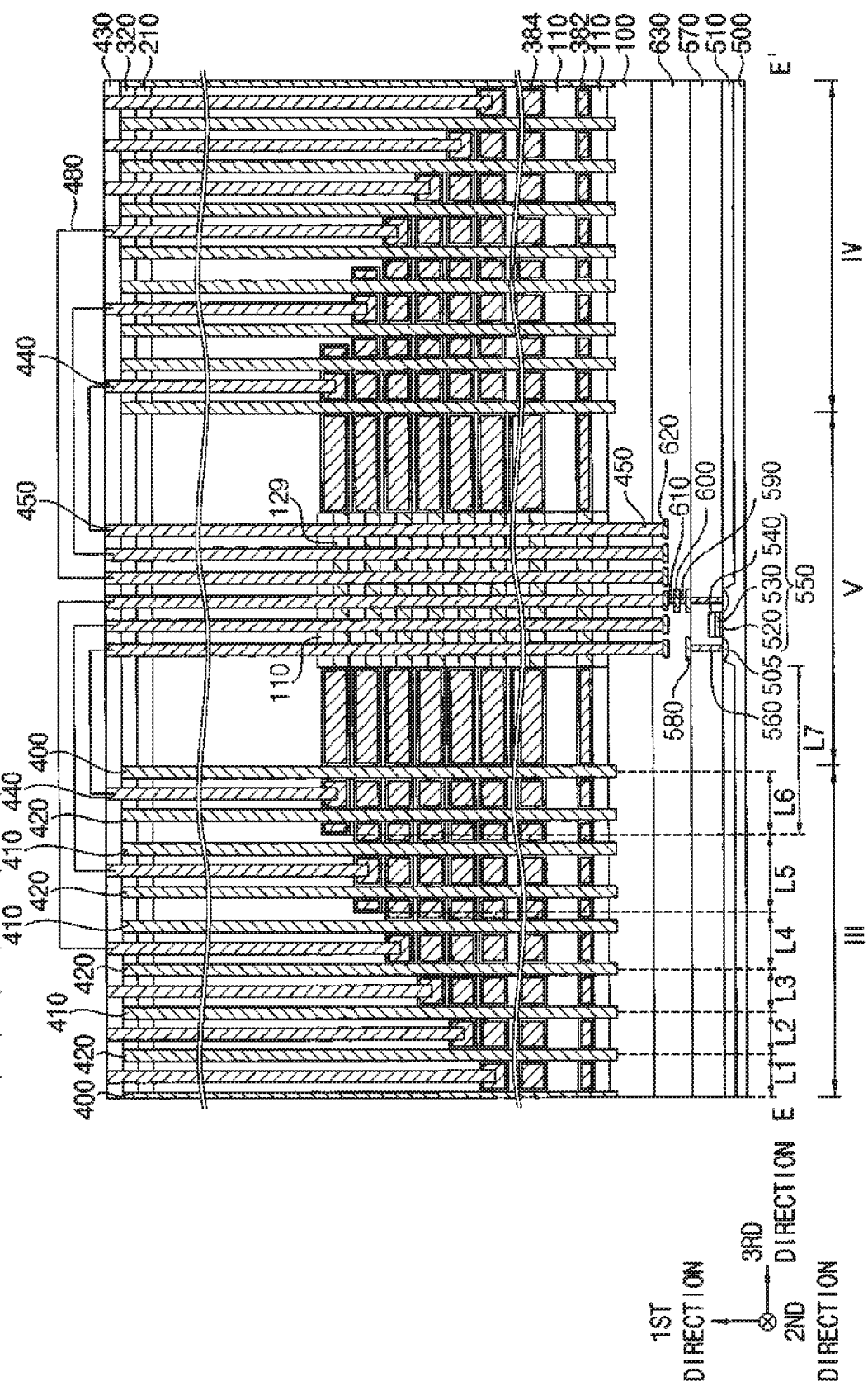

VERTICAL MEMORY DEVICES

CROSS-REFERENCE TO RELATED APPLICATIONS

This application claims priority under 35 USC § 119 to Korean Patent Application No. 10-2018-0121516, filed on Oct. 12, 2018 in the Korean Intellectual Property Office (KIPO), the contents of which are herein incorporated by reference in their entirety.

TECHNICAL FIELD

The present disclosure relate to memory and, more particularly, to vertical memory devices.

DISCUSSION OF THE RELATED ART

When a VNAND flash memory device is manufactured, sacrificial layers and insulation layers are alternately and repeatedly stacked. Some of the sacrificial layers are patterned to form steps in a staircase region in which contact plugs connected to upper wirings are formed, and an etching process may be performed using a photoresist pattern partially covering the steps to form a mold having a stair structure. As the number of steps included in the mold increases, the area of the mold may increase so that the integration degree of the VNAND flash memory device may decrease.

SUMMARY

A vertical memory device includes a substrate having a cell array region and a staircase region at least partially surrounding the cell array region. A plurality of gate electrodes is spaced apart from each other in each of first and third directions within the cell array region and the staircase region of the substrate. Each of the plurality of gate electrodes extends in a second direction. The first direction is substantially perpendicular to an upper surface of the substrate. The third direction is substantially parallel to the upper surface of the substrate. The second direction is substantially parallel to the upper surface of the substrate and crosses the third direction. A channel extends in the first direction within the cell array region of the substrate. The channel extends through at least one of the plurality of gate electrodes. End portions in the second direction of the plurality of gate electrodes form a first stair structure on the staircase region of the substrate. The first stair structure includes a plurality of first steps, a second step, and a third step, sequentially disposed in the third direction. Each of the plurality of first steps has a first length in the third direction. The second step has a second length in the third direction that is greater than the first length. The third step has a third length in the third direction that is greater than the second length.

A vertical memory device includes a substrate having a cell array region and a staircase region at least partially surrounding the cell array region. A plurality of gate electrodes is spaced apart from each other in each of first and third directions within the cell array region and the staircase region of the substrate. Each of the plurality of gate electrodes extends in a second direction. The first direction is substantially perpendicular to an upper surface of the substrate. The third direction is substantially parallel to the upper surface of the substrate. The second direction is substantially parallel to the upper surface of the substrate and crosses the third direction. A channel extends in the first direction within the cell array region of the substrate. The channel extends through at least one of the plurality of gate electrodes. End portions in the second direction of the plurality of gate electrodes form first and second stair structures on the staircase region of the substrate. Each of the first and second stair structures has steps. The first and second stair structures are symmetric with each other in the third direction. A mold is disposed between the first and second stair structures. The mold contacts sidewalls of the first and second stair structures and includes an insulating material.

A vertical memory device includes a substrate having a cell array region and a staircase region at least partially surrounding the cell array region. A plurality of gate electrodes is spaced apart from each other in each of first and third directions within the cell array region and the staircase region of the substrate. Each of the plurality of gate electrodes extends in a second direction. The first direction is substantially perpendicular to an upper surface of the substrate. The third direction is substantially parallel to the upper surface of the substrate. The second direction is substantially parallel to the upper surface of the substrate and crosses the third direction. A channel extends in the first direction within the cell array region of the substrate. The channel extends through at least one of the plurality of gate electrodes. End portions in the second direction of the plurality of gate electrodes form a stair structure on the staircase region of the substrate. The stair structure includes first to sixth step layers sequentially stacked in the first direction. The first to sixth step layers have lengths in the third direction gradually decreasing from a lowermost one toward an uppermost one thereof. Each of the first and second step layers includes end portions of four gate electrodes, of the plurality of gate electrodes, disposed in the third direction. Each of the third and fourth step layers includes end portions of three gate electrodes, of the plurality of gate electrodes, disposed in the third direction. The fifth step layer includes end portions of two gate electrodes, of the plurality of gate electrodes, disposed in the third direction. The sixth step layer includes an end portion of one gate electrode of the plurality of gate electrodes.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 1 to 42 are plan views, cross-sectional views, and perspective views illustrating a method of manufacturing a vertical memory device in accordance with exemplary embodiments of the present inventive concept;

FIG. 45 is a cross-sectional view taken along a line E-E' of FIG. 39 illustrating a vertical memory device in accordance with exemplary embodiments of the present inventive concept.

DETAILED DESCRIPTION

The above and other aspects and features of the vertical memory devices and the methods of manufacturing the same, in accordance with exemplary embodiments of the present inventive concept, will become readily understood from detail descriptions that follow, with reference to the accompanying drawings.

FIGS. 1 to 42 are plan views, cross-sectional views, and perspective views illustrating a method of manufacturing a vertical memory device in accordance with exemplary embodiments of the present inventive concept. FIGS. 1, 13, 20, 24, 29, 31, 33, 36-37 and 39 are plan views, FIGS. 2, 4, 6, 21-23, 25-28, 30, 32, 34-35, 38 and 40-42 are cross-sectional views, and FIGS. 3, 5, 7-12 and 14-19 are perspective views.

FIGS. 13, 20, 24 and 36 are plan views illustrating a region X of FIG. 1, FIGS. 29, 31, 33, 37 and 39 are plan views illustrating a region Y of FIG. 1, and FIGS. 3, 5, 7-12 and 14-19 are perspective views illustrating the region X of FIG. 1.

Figure 2:
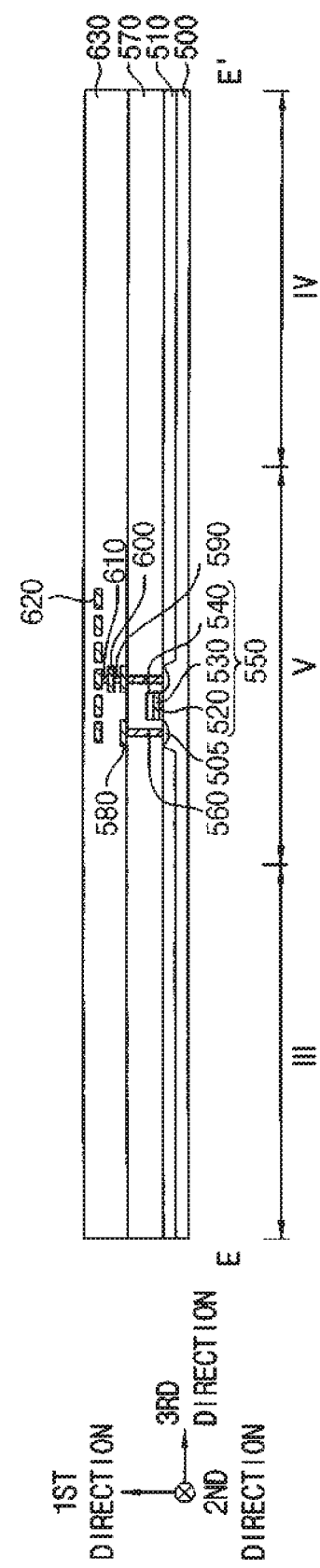
Figure 4:
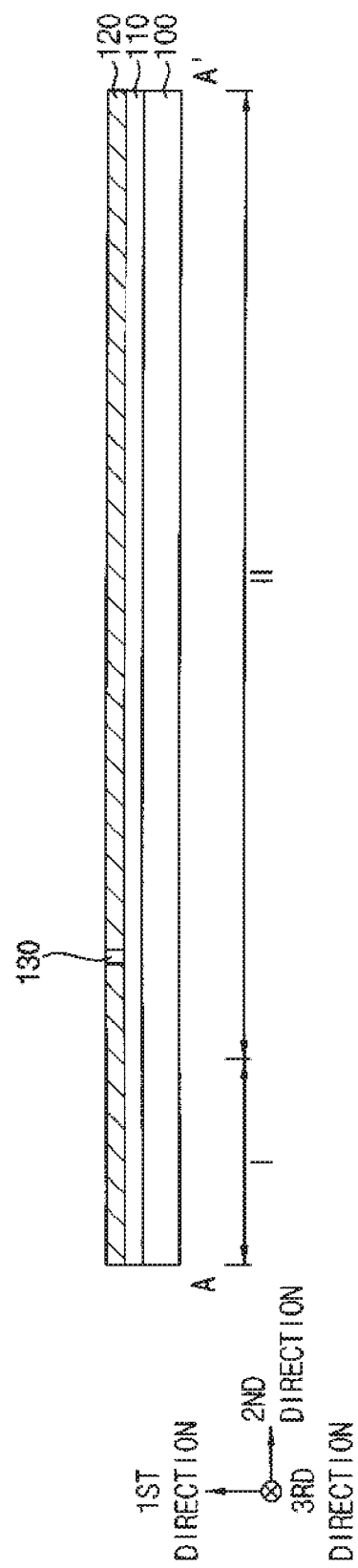
Figure 21:
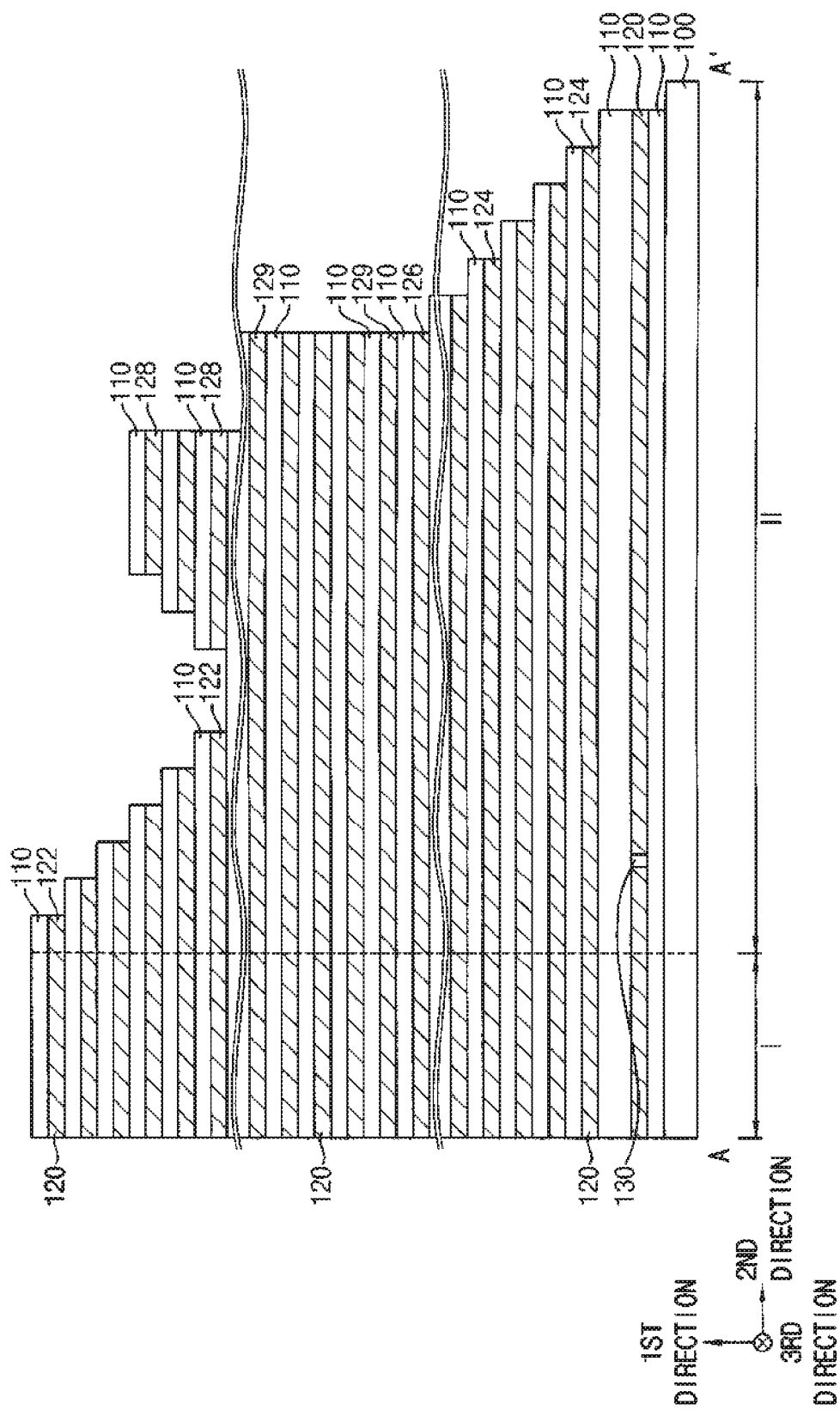
Figure 22:
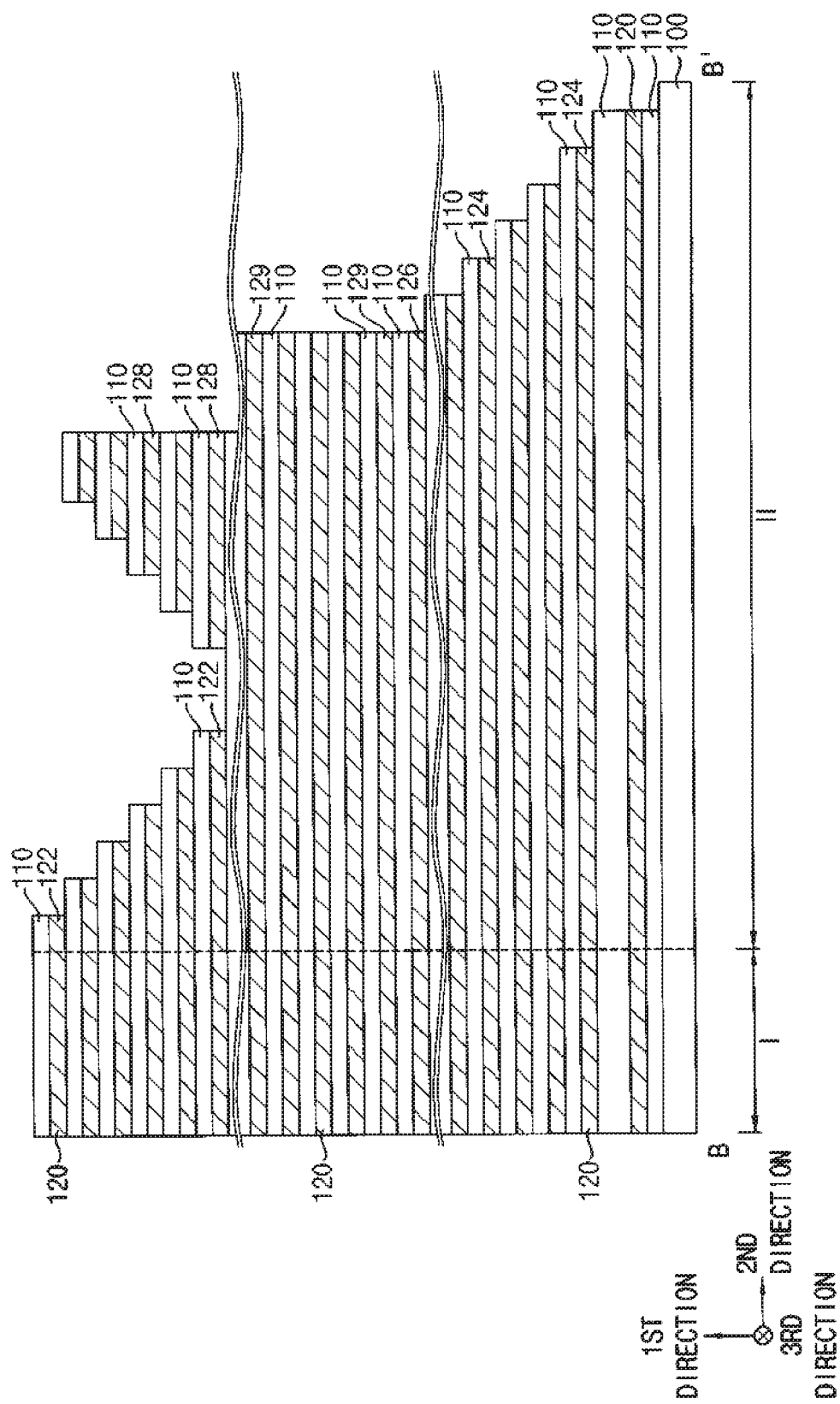
Figure 42:
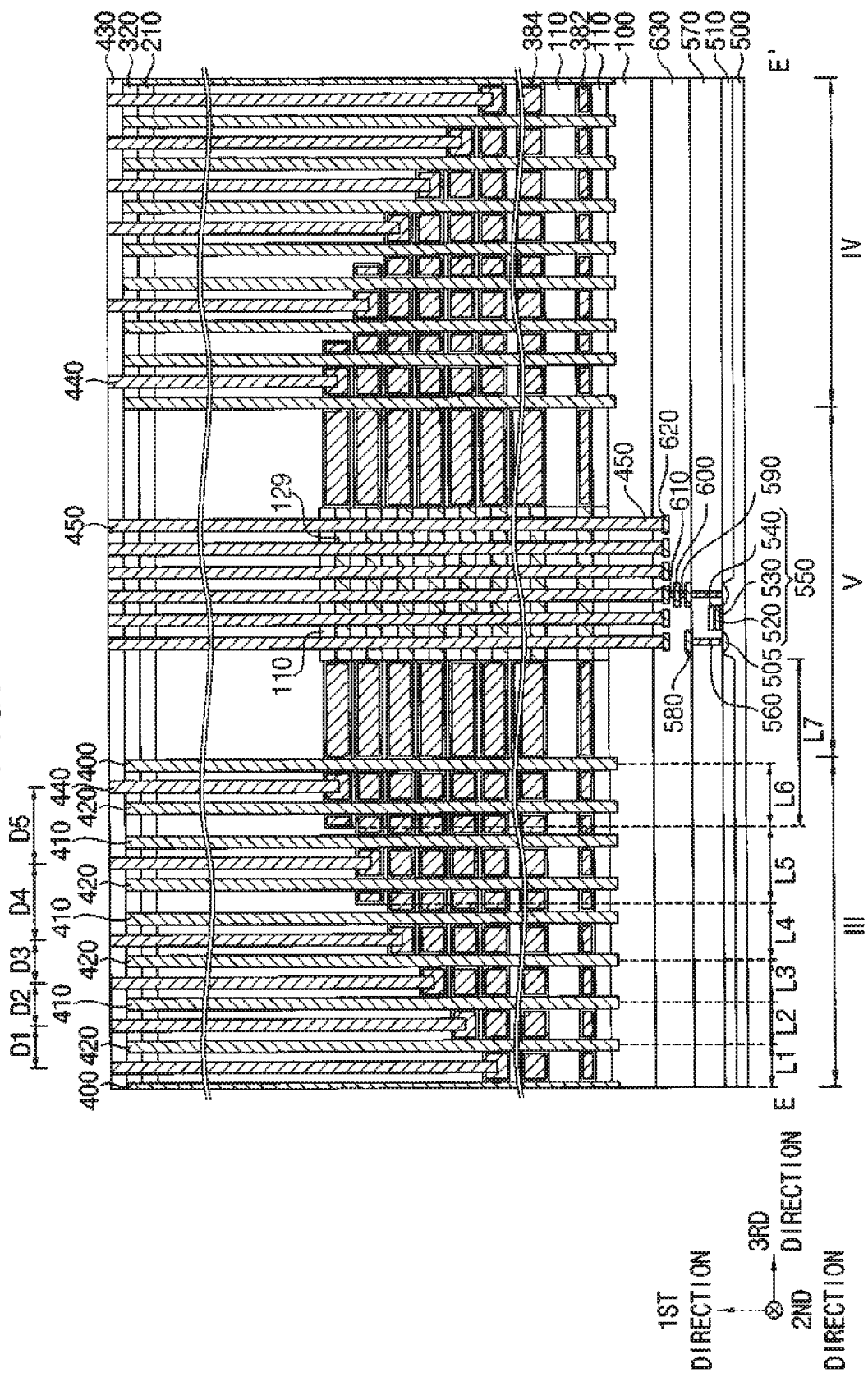

FIGS. 4 and 21 are cross-sectional views taken along a line A-A' of FIG. 1, FIGS. 6, 22-23, 28, 30 and 40 are cross-sectional views taken along a line B-B' of FIG. 1, FIGS. 25-27 and 41 are cross-sectional views taken along a line C-C' of FIG. 1, FIGS. 32, 34-35 and 38 are cross-sectional views taken along a line D-D' of FIG. 1, and FIGS. 2 and 42 are cross-sectional views taken along a line E-E' of FIG. 1.

Hereinafter, a direction substantially perpendicular to a plane of an upper surface of a substrate may be defined as a first direction, and two directions along the plane of the upper surface of the substrate that cross each other may be defined as second and third directions, respectively. In exemplary embodiments of the present inventive concept, the second and third directions may be substantially perpendicular to each other.

Referring to FIG. 1, a substrate 500 may include a first region I and a second region II at least partially surrounding the first region I.

The substrate 500 may include silicon, germanium, silicon-germanium, or a III-V compound such as GaP, GaAs, GaSb, etc. In some exemplary embodiments of the present inventive concept, the substrate 500 may be a silicon-on-insulator (SOI) substrate or a germanium-on-insulator (GOI) substrate. In exemplary embodiments of the present inventive concept, the first region I of the substrate 500 may be a cell array region in which memory cells may be formed, and the second region II of the substrate 500 may be a staircase region in which contact plugs connected to the memory cells are formed.

In exemplary embodiments of the present inventive concept, the vertical memory device may have a cell over peri (COP) structure. For example, circuit patterns for driving memory cells might not be formed on the periphery of the memory cells, but may rather be formed under the memory cells. Thus, a circuit pattern region and a cell array region may be vertically stacked on the substrate 500, and the circuit patterns may also be referred to as lower circuit patterns. However, the inventive concepts is not limited thereto, and even if the vertical memory device has a COP structure, the substrate 500 may further include a peripheral circuit region at least partially surrounding the second region II in which some of the circuit patterns may be formed.

The region X shown in FIG. 1 is a portion of the second region II of the substrate 500, and the region Y includes a portion of the region X and a portion of the first region I of the substrate 500 adjacent thereto in the second direction. In exemplary embodiments of the present inventive concept, a plurality of region X's may be disposed in the third direction, and the region Y may be disposed at each of opposite sides of the region X in the third direction. Portions of the substrate 500 at which the regions X and Y overlap each other may be referred to as third and fourth regions III and IV, respectively. A portion of the region X between the third and fourth regions III and IV may be referred to as a fifth region V.

Referring to FIG. 2, circuit patterns may be formed on the substrate 500, and first and second lower insulating interlayers 570 and 630 may be formed on the substrate 500 to cover the circuit patterns.

The substrate 500 may include a field region on which an isolation pattern 510 is formed, and an active region on which no isolation pattern 510 is formed. The isolation pattern 510 may be formed by, e.g., a shallow trench isolation (STI) process.

The circuit patterns may include transistors, lower contact plugs, lower wirings, lower vias, etc. For example, a transistor including a lower gate structure 550 on the substrate 500 and a first impurity region 505 at an upper portion of the active region of the substrate 500 adjacent thereto may be formed. The lower gate structure 550 may include a lower gate insulation pattern 520, a lower gate electrode 530, and a lower gate mask 540 that are sequentially stacked.

The first lower insulating interlayer 570 may be formed on the substrate 500 to cover the transistor, and a lower contact plug 560 may extend through the first lower insulating interlayer 570 to contact the first impurity region 505. A first lower wiring 580 may be formed on the first lower insulating interlayer 570 to contact an upper surface of the lower contact plug 560. A first lower via 590, a second lower wiring 600, a second lower via 610, and a third lower wiring 620 may be sequentially stacked on the first lower wiring 580. In exemplary embodiments of the present inventive concept, a plurality of third lower wirings 620 may be formed in the third direction. Each of the first to third lower wirings 580, 600, and 620 and each of the first and second lower vias 590 and 610 may be formed by a damascene process or a patterning process.

The second lower insulating interlayer 630 may be formed on the first lower insulating interlayer 570 to cover the first to third lower wirings 580, 600, and 620 and the first and second lower vias 590 and 610.

Various circuit patterns may be formed on the substrate 500, however, these circuit patterns are not shown in the figures to reduce the complexity of the drawings.

Figure 3:
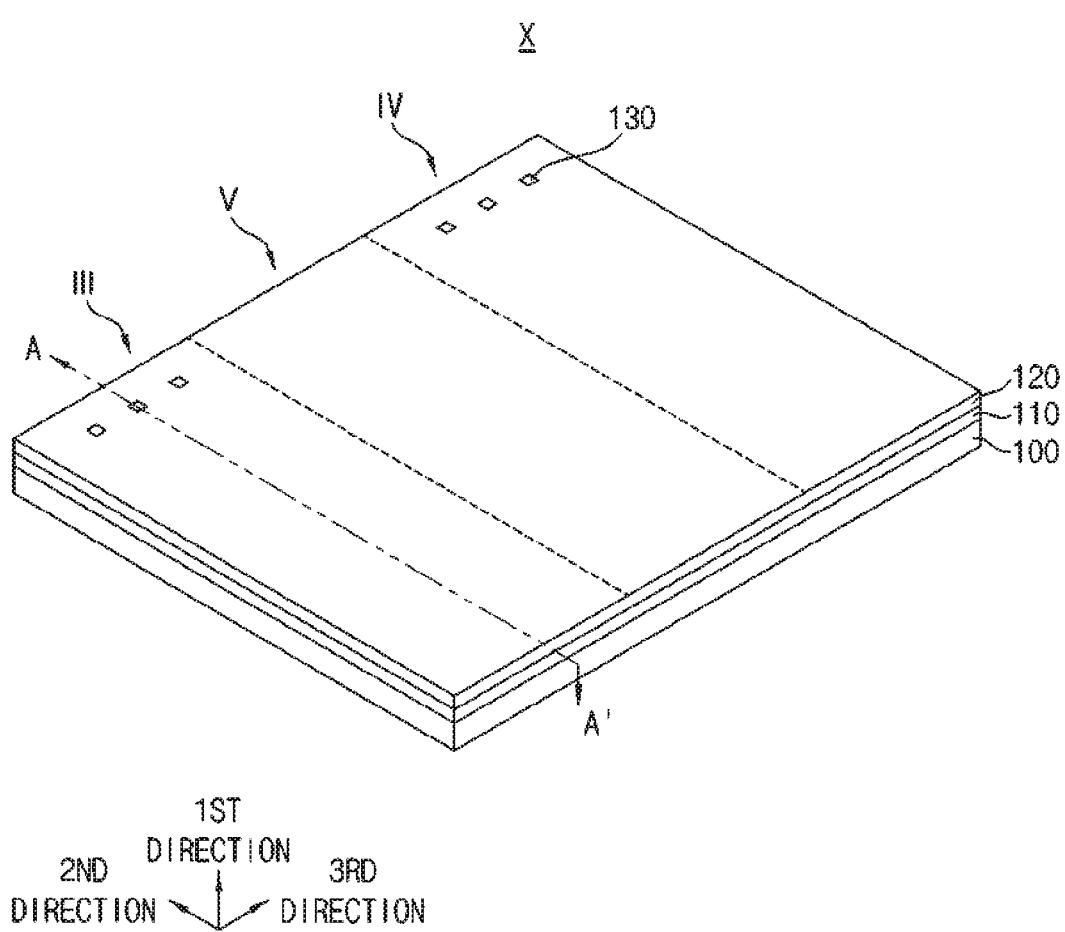

Referring to FIGS. 3 and 4, a base pattern 100 may be formed on the second lower insulating interlayer 630, and an insulation layer 110 and a sacrificial layer 120 may be sequentially formed on the base pattern 100.

The base pattern 100 may include a semiconductor material, e.g., silicon. The insulation layer 110 may include an oxide, e.g., silicon oxide. The sacrificial layer 120 may include a material having an etching selectivity with respect to the insulation layer 110, e.g., a nitride such as silicon nitride.

A portion of the sacrificial layer 120 on the second region II of the substrate 500 may be removed to form a first opening exposing the insulation layer 110, and a first division pattern 130 may be formed to fill the first opening.

In exemplary embodiments of the present inventive concept, a plurality of first division patterns 130 may be formed in the third direction on each of the third and fourth regions III and IV of the substrate 500. In the figures, three first division patterns 130 are shown in each of the third and fourth regions III and IV. The first division pattern 130 may include an oxide, e.g., silicon oxide.

Figure 5:
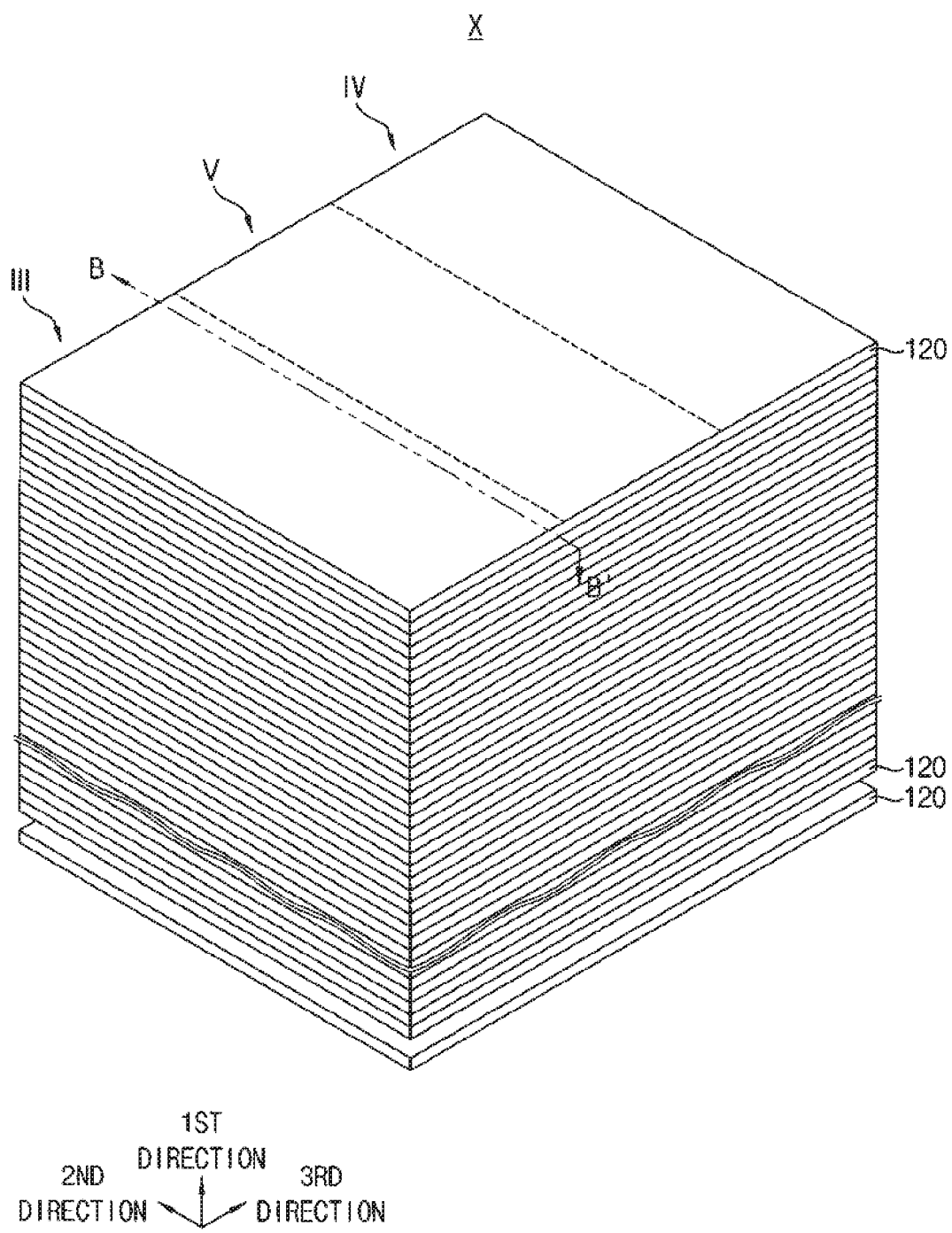
Figure 6:
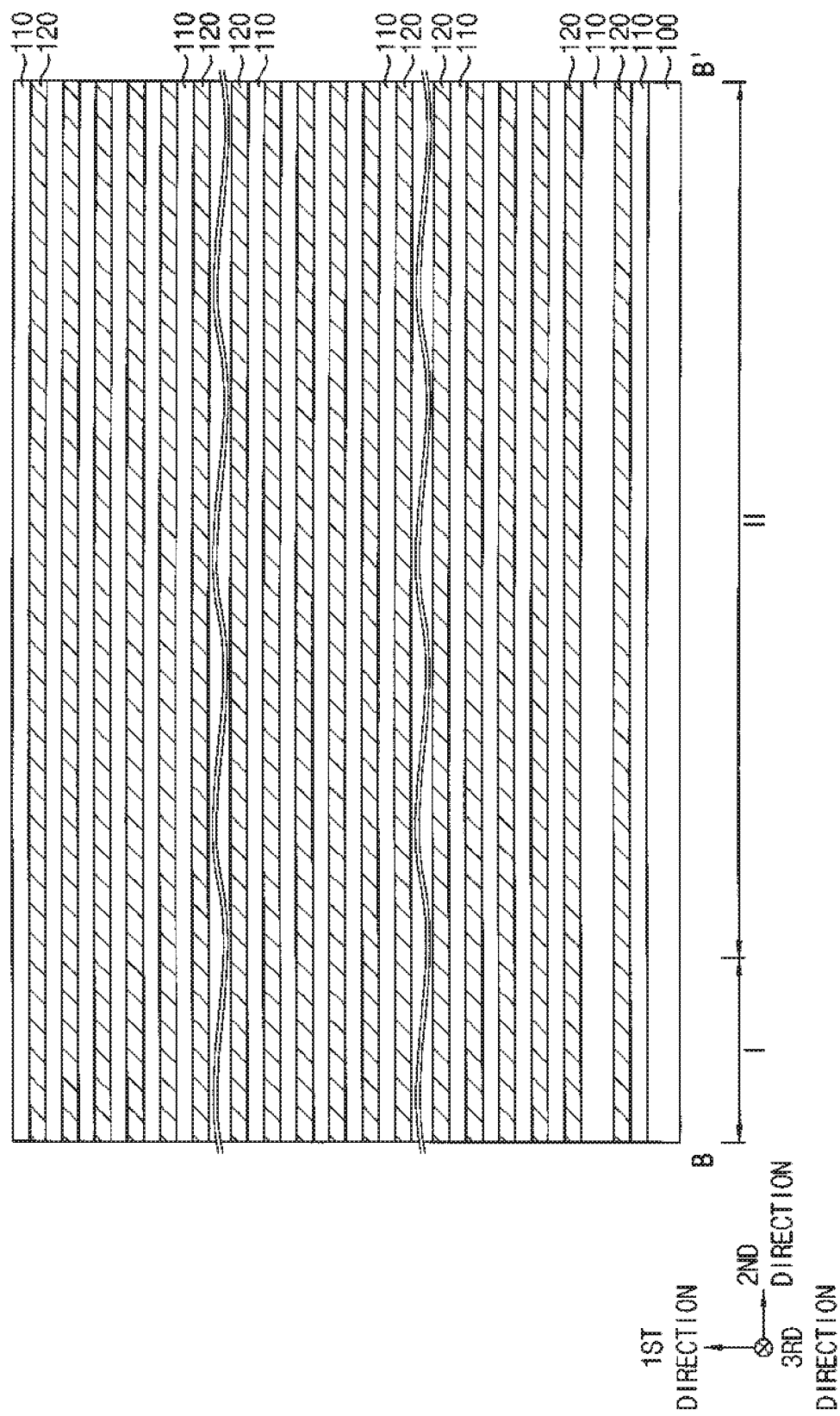

Referring to FIGS. 5 and 6, the insulation layer 110 and the sacrificial layer 120 may be further formed on the sacrificial layer 120 and the first division pattern 130 alternately and repeatedly, so that the insulation layers 110 and the sacrificial layers 120 may be alternately stacked in the first direction.

The insulation layers 110 may not be seen in the perspective views, including FIG. 5, but the sacrificial layers 120 will be shown and it is to be understood that the insulation layer 110 is disposed therebelow. Etching processes on the sacrificial layers 120 may be performed not only the sacrificial layers 120 but also the insulation layers 110 each of which may form a pair with one of the sacrificial layers 120 directly therebeneath, and for the convenience of explanation, when the etching processes are described with reference to the perspective views, the insulation layers 110 will not be explained.

Figure 7:
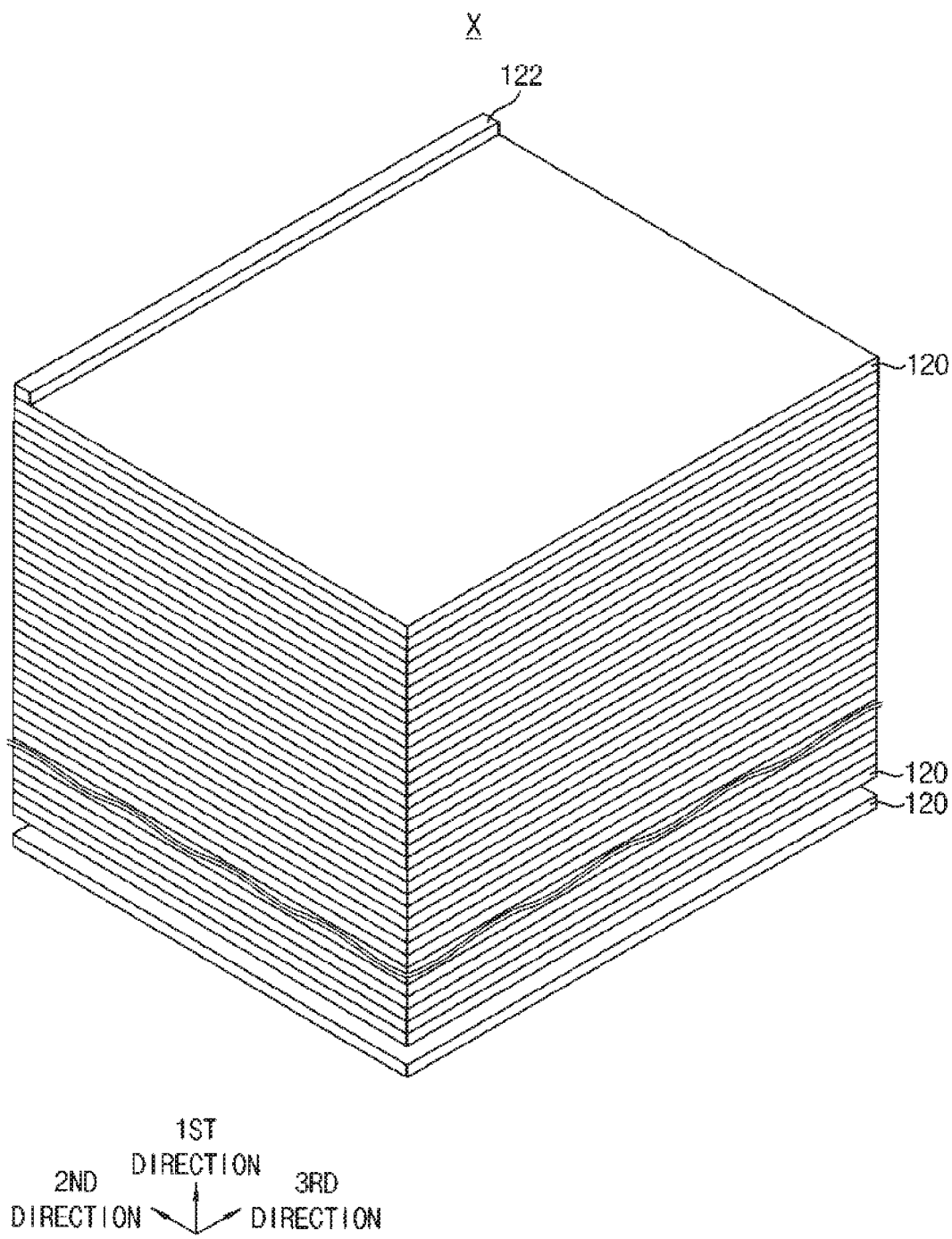

Referring to FIG. 7, a first photoresist may be formed on an uppermost one of the sacrificial layers 120 to cover the first region I and an edge portion of the second region II adjacent thereto, and the uppermost one of the sacrificial layers 120 may be etched using the first photoresist as an etching mask to form a first sacrificial pattern 122 having a rectangular ring shape at least partially surrounding the uppermost one of the sacrificial layers 120 on the first region I of the substrate 500.

However, FIG. 7 shows only a portion of the second region II of the substrate 500, i.e., the region X, and thus only a portion of the first sacrificial pattern 122 having the rectangular ring shape, for example, a portion having a bar shape extending in the third direction is shown. Hereinafter, instead of entire shapes of various sacrificial patterns on the second region II of the substrate 500 that may be formed by etching the sacrificial layers 120, only shapes of the various sacrificial patterns in the region X will be described. During the formation of a mold illustrated with reference to the perspective views, the portion of the sacrificial layer 120 on the first region I of the substrate 500 may always be covered so as not to be etched.

After forming the first sacrificial pattern 122, the first photoresist pattern may be removed by, e.g., an ashing process and/or a stripping process.

Figure 8:
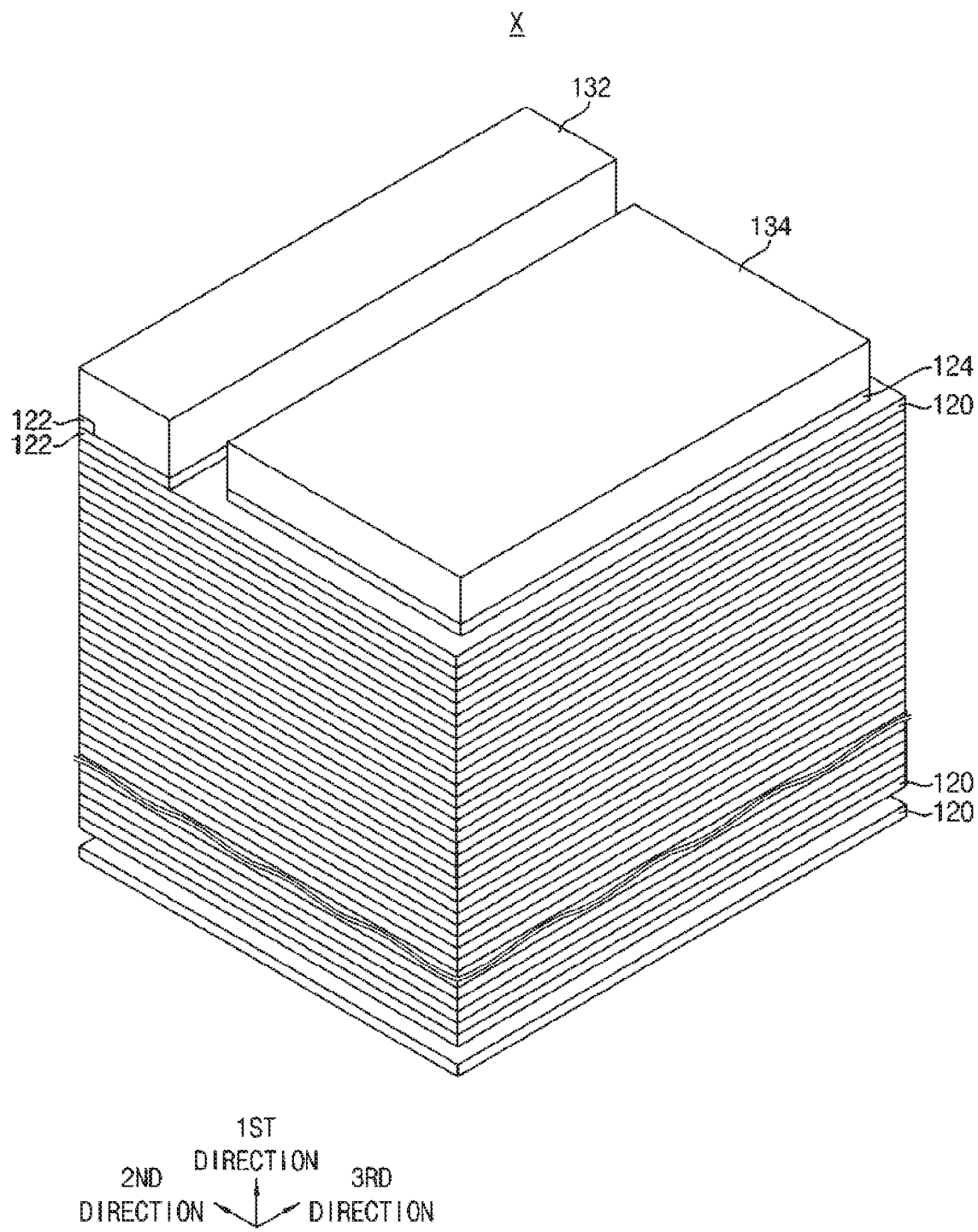

Referring to FIG. 8, a second photoresist pattern 132 covering the first sacrificial pattern 122 and having a length in the second direction greater than that of the first sacrificial pattern 122, and a third photoresist pattern 134 covering a portion of the sacrificial layer 120 in the region X and having a rectangular shape in a plan view, which may be spaced apart from the second photoresist pattern 132 in the second direction, may be formed on one of the sacrificial layers 120 at a second level from the uppermost level (hereinafter, an n-th level from the uppermost level will be simply referred to as an n-th level), and the one of the sacrificial layers 120 at the second level may be etched using the second and third photoresist patterns as an etching mask.

Thus, the first sacrificial pattern 122 may be further formed at the second level and the first sacrificial pattern 122 of the second level may have a length greater than that of the first sacrificial pattern 122 of the first level. A second sacrificial pattern 124, which may have a rectangular shape in a plan view, may be formed at the second level to be spaced apart from the first sacrificial pattern 122 at the second level.

Figure 9:
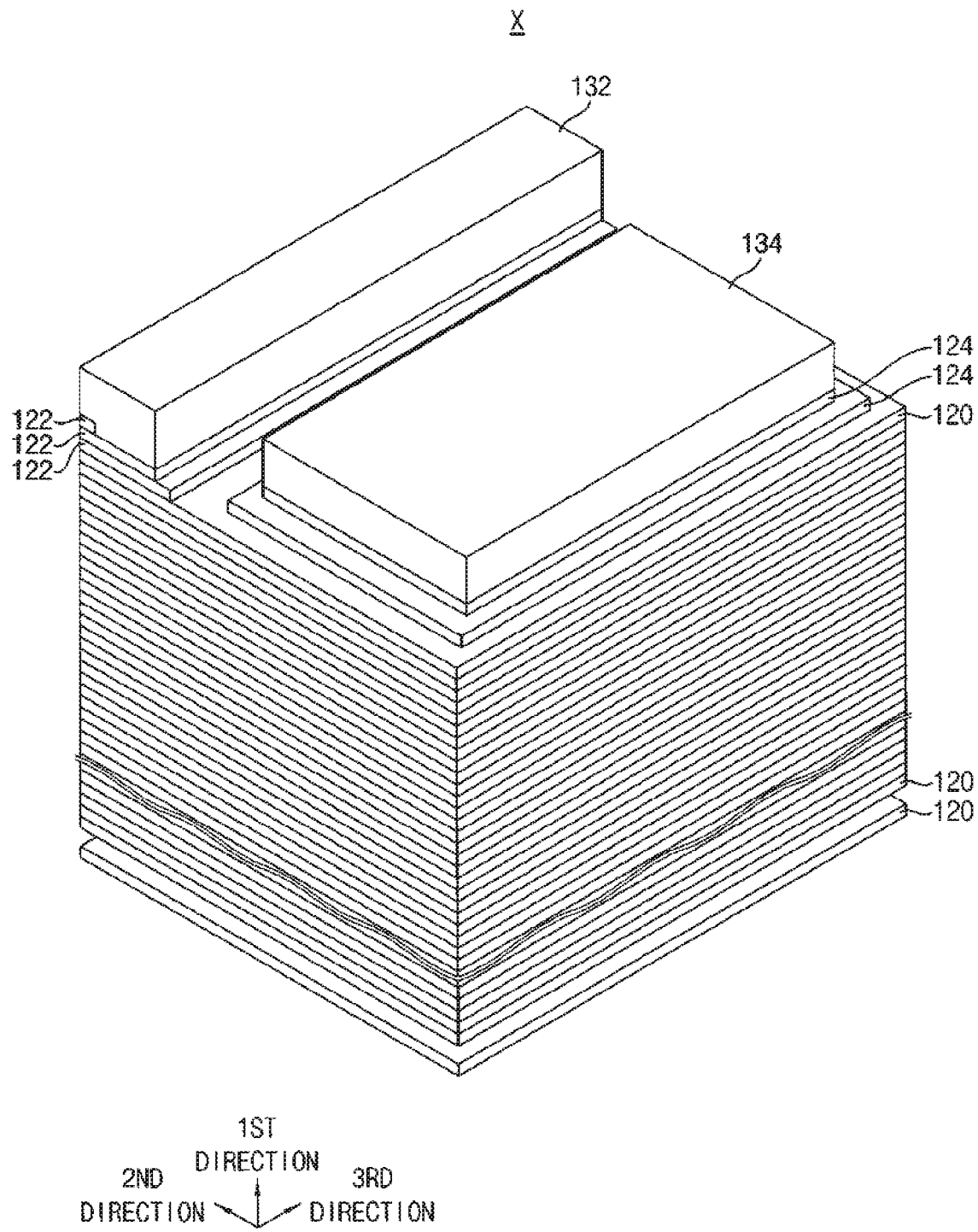

Referring to FIG. 9, a first trimming process in which areas of the second and third photoresist patterns 132 and 134 are reduced may be performed, and the first and second sacrificial patterns 122 and 124 and one of the sacrificial layers 120 at a third level may be etched using the reduced second and third photoresist patterns 132 and 134 as an etching mask.

Thus, a length in the second direction of the first sacrificial pattern 122 at the second level may be reduced, and the first sacrificial pattern 122 may be further formed at the third level. An area of the second sacrificial pattern 124 at the second level may be reduced, and the second sacrificial pattern 124 may be further formed at the third level.

In exemplary embodiments of the present inventive concept, the first trimming process may be performed by an exposure process on the second and third photoresist patterns 132 and 134 and a developing process on unexposed portions of the second and third photoresist patterns 132 and 134.

Figure 10:
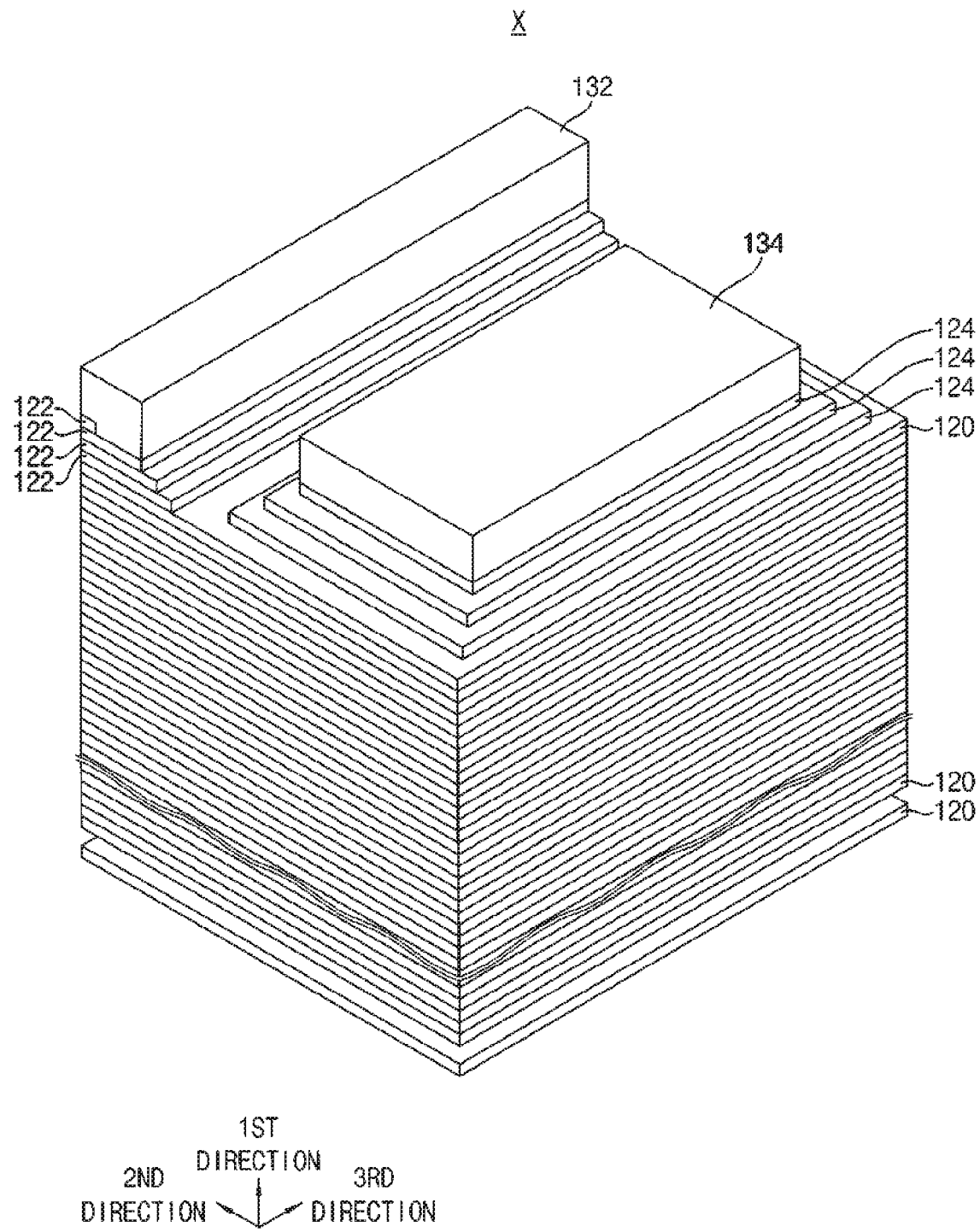

Referring to FIG. 10, a second trimming process may be performed. For example, after reducing the areas of the second and third photoresist patterns 132 and 134, the first and second sacrificial patterns 122 and 124 and one of the sacrificial layers 120 at a fourth level may be etched using the reduced second and third photoresist patterns 132 and 134 as an etching mask.

Thus, lengths in the second direction of the first sacrificial patterns 122 at the second and third levels may be reduced, and the first sacrificial pattern 122 may be further formed at the fourth level. Additionally, areas of the second sacrificial patterns 124 at the second and third levels may be reduced, and the second sacrificial pattern 124 may be further formed at the fourth level.

Figure 11:
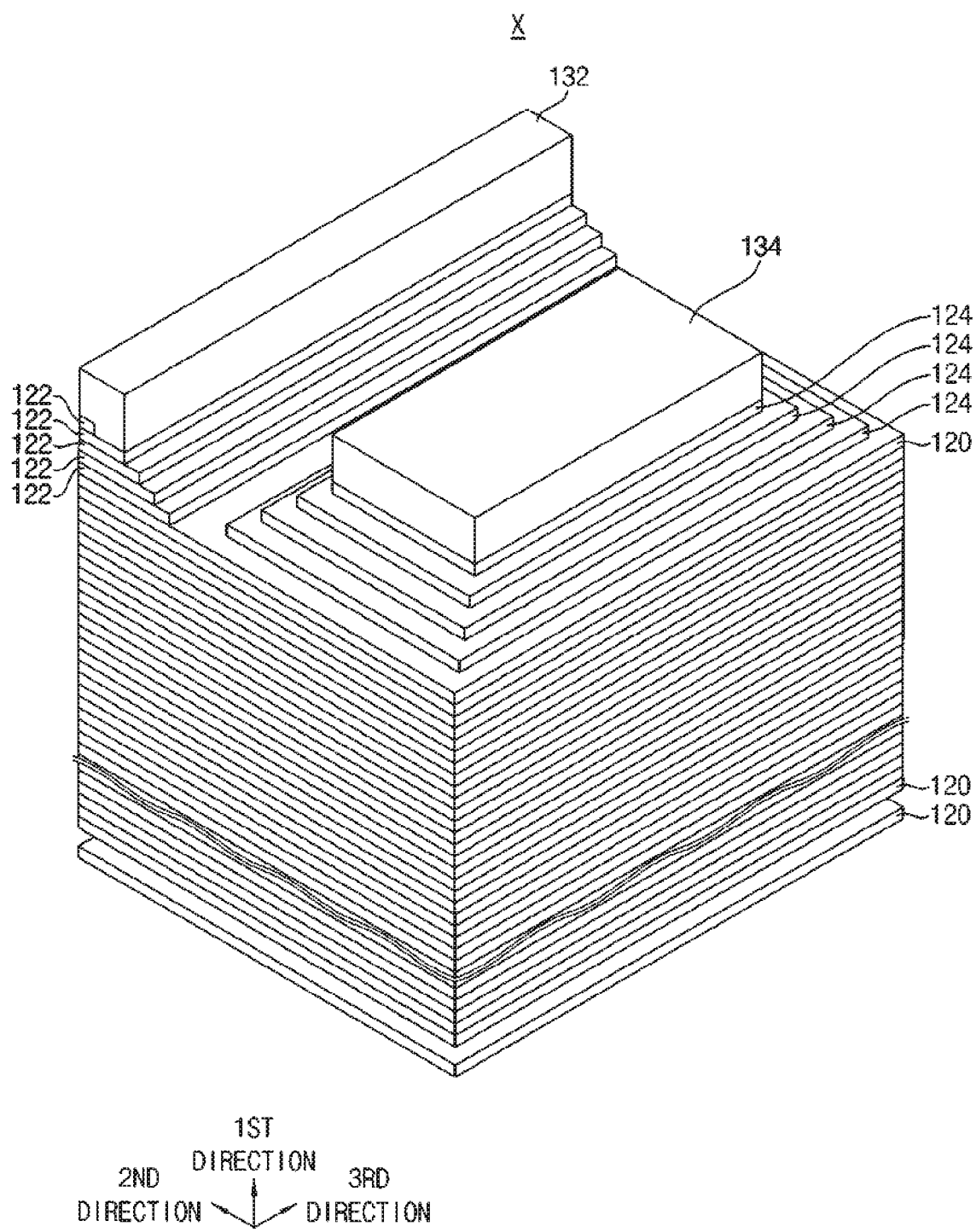

Referring to FIG. 11, a third trimming process may be performed. For example, after reducing the areas of the second and third photoresist patterns 132 and 134, the first and second sacrificial patterns 122 and 124 and one of the sacrificial layers 120 at a fifth level may be etched using the reduced second and third photoresist patterns 132 and 134 as an etching mask.

Thus, lengths in the second direction of the first sacrificial patterns 122 at the second to fourth levels may be reduced, and the first sacrificial pattern 122 may be further formed at the fifth level. Additionally, areas of the second sacrificial patterns 124 at the second to fourth levels may be reduced, and the second sacrificial pattern 124 may be further formed at the fifth level.

Figure 12:
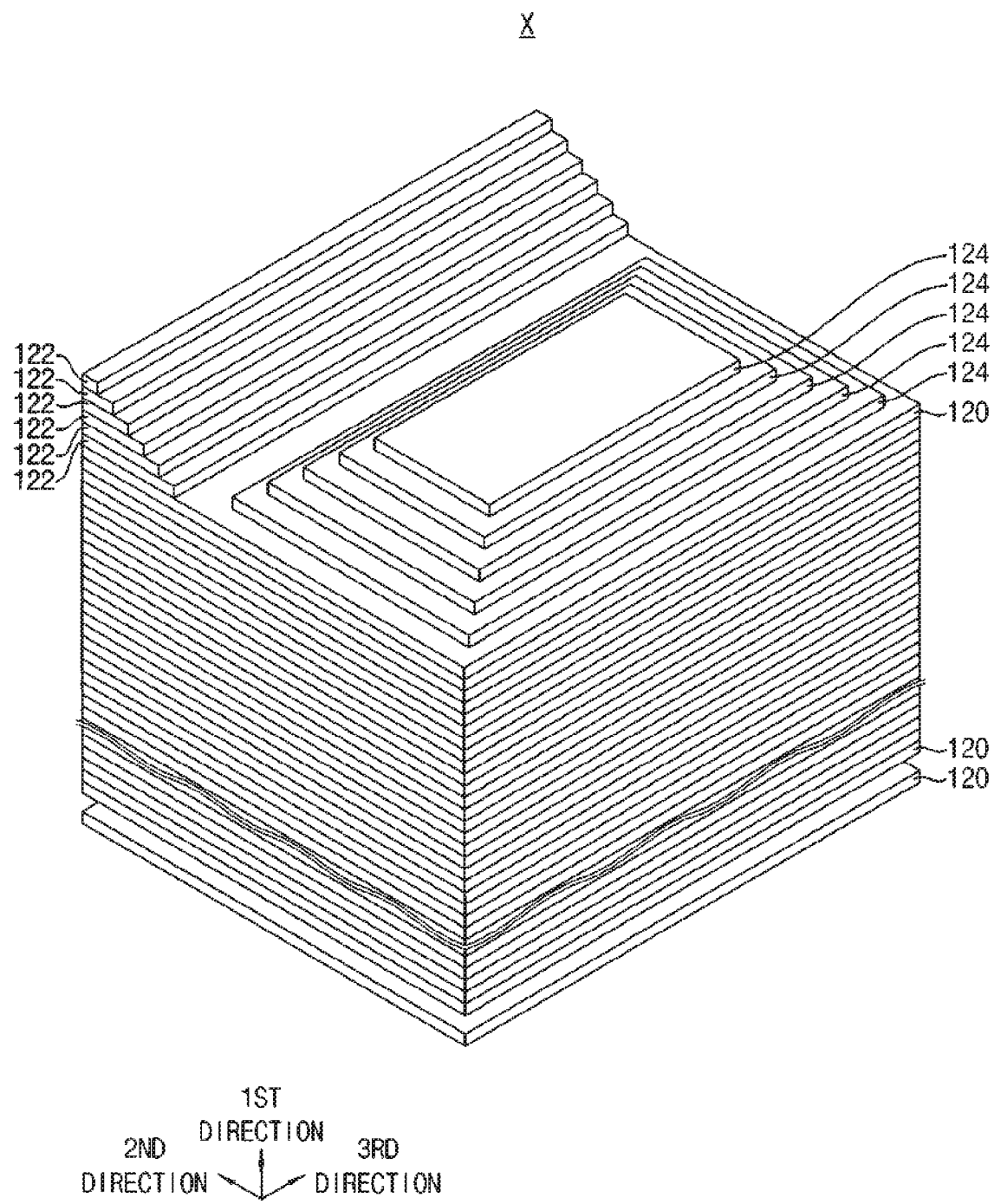

Referring to FIGS. 12 and 13, a fourth trimming process may be performed. For example, after reducing the areas of the second and third photoresist patterns 132 and 134, the first and second sacrificial patterns 122 and 124 and one of the sacrificial layers 120 at a sixth level may be etched using the reduced second and third photoresist patterns 132 and 134 as an etching mask.

Thus, lengths in the second direction of the first sacrificial patterns 122 at the second to fifth levels may be reduced, and the first sacrificial pattern 122 may be further formed at the sixth level. Additionally, areas of the second sacrificial patterns 124 at the second to fifth levels may be reduced, and the second sacrificial pattern 124 may be further formed at the sixth level.

The second and third photoresist patterns 132 and 134 may be removed.

Thus, the first sacrificial patterns 122 may be stacked at six levels, respectively, in a staircase shape on one of the sacrificial layers 120 at a seventh level, and the second sacrificial patterns 124 may be stacked at five levels, respectively, in a staircase shape to be spaced apart from the first sacrificial patterns 122 on the one of the sacrificial layers 120 at the seventh level.

A structure such as the first sacrificial patterns 122 or the second sacrificial patterns 124 stacked in a staircase shape in the first direction may be referred to as "a stair structure." Each of layers forming the stair structure may be referred to as "a step layer," and a portion of each step layer that is not covered by upper step layers but is rather exposed may be referred to as "a step."

In exemplary embodiments of the present inventive concept, a first stair structure consisting of one of the sacrificial layers 120 at the seventh level and the second sacrificial patterns 124 stacked at five levels, respectively, thereover on the third region III of the substrate 500 may include first, second, third, fourth, fifth and sixth steps, which may have first, second, third, fourth, fifth and sixth lengths L1, L2, L3, L4, L5 and L6, respectively, in the third direction. In exemplary embodiments of the present inventive concept, the fifth length L5 may be greater than the fourth and sixth lengths L4 and L6, which may be greater than the first to third lengths L1, L2 and L3. Additionally, the fourth and sixth lengths L4 and L6 may be substantially the same as each other, and the first to third lengths L1, L2 and L3 may be substantially the same as each other.

The first to sixth lengths L1 to L6 of the respective first to sixth steps in the third direction may be achieved by controlling the reduction ratio of the third photoresist pattern 134 during the trimming processes. For example, as the repetition number of the trimming process on a photoresist pattern increases, the difference between the desired reduction ratio and the actual reduction ratio of the photoresist pattern may increase. Thus, the uppermost one of the second sacrificial patterns 124 that may be formed by the etching process using the third photoresist pattern 134, after the fourth trimming process, may have an area having a big difference from the desired area, and as a result, the length of the sixth step in the third direction may be too large so that the length of the fifth step in the third direction may be too small.

In the inventive concept, in consideration of the error that may be generated during the fourth trimming process, the reduction ratio of the third photoresist pattern 134 may increase so that the fifth step may have a length that is not smaller than those of other steps. Additionally, in consideration of the error that may be generated during the third trimming process, the reduction ratio of the third photoresist pattern 134 may increase so that the fourth step may have a length that is not smaller than those of the first to third steps thereunder. Thus, the fourth length L4 of the fourth step may be greater than the first to third lengths L1, L2 and L3 of the underlying first to third steps, the fifth length L5 of the fifth step may be greater than the fourth length L4 of the fourth step, and the sixth length L6 of the sixth step may be substantially the same as or similar to the fourth length L4.

A second stair structure may be formed on the fourth region IV of the substrate 500, and the first and second stair structures may be symmetric with respect to a straight line extending in the second direction therebetween. For example, the second stair structure may consist of the one of the sacrificial layer 120 at the seventh level and the second sacrificial patterns 124 stacked at five levels, respectively, thereover on the fourth region IV of the substrate 500, and may include seventh, eighth, ninth, tenth, eleventh and twelfth steps, which may have the first, second, third, fourth, fifth and sixth L1, L2, L3, L4, L5 and L6, respectively, in the third direction.

Figure 14:
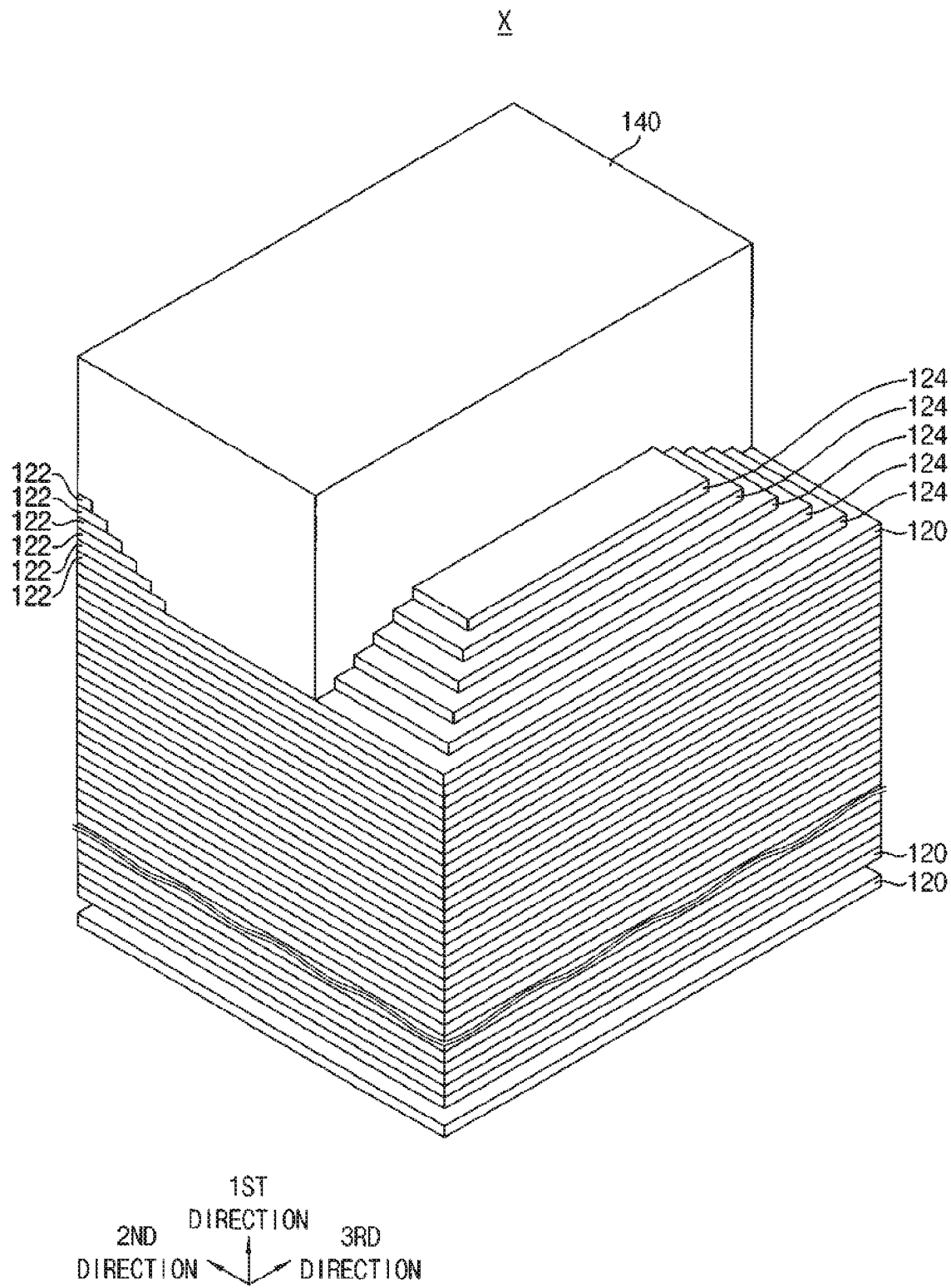

Referring to FIG. 14, a fourth photoresist pattern 140 may be formed on the one of the sacrificial layers 120 at the seventh level to cover the first sacrificial patterns 122 and portions of the second sacrificial patterns 124 adjacent thereto.

Figure 15:
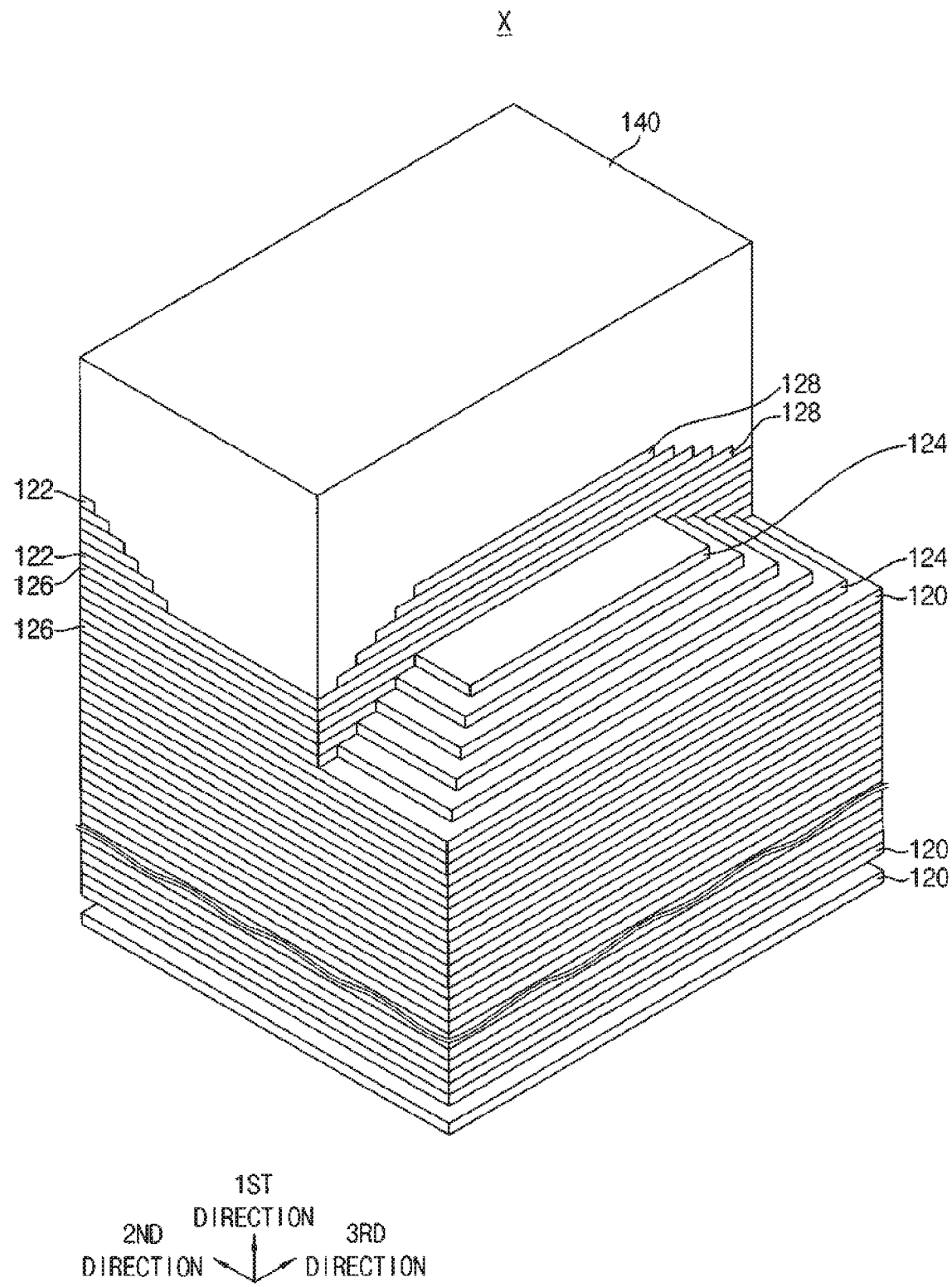

Referring to FIG. 15, the second sacrificial patterns 124 and one or more of the sacrificial layers 120 at seventh to twelfth levels, respectively, may be etched using the fourth photoresist pattern 140 as an etching mask.

Thus, third sacrificial patterns 126 having a length in the second direction greater than those of the first sacrificial patterns 122 may be formed at seventh to twelfth levels, respectively, and portions of the second sacrificial patterns 124 not covered by the fourth photoresist pattern 140 may be moved to the eighth to twelfth levels, respectively. Remaining portions of the second sacrificial patterns 124 covered by the fourth photoresist pattern 140 may be transformed into fourth sacrificial patterns 128, respectively, on one of the third sacrificial patterns 126 at the seventh level.

Figure 16:
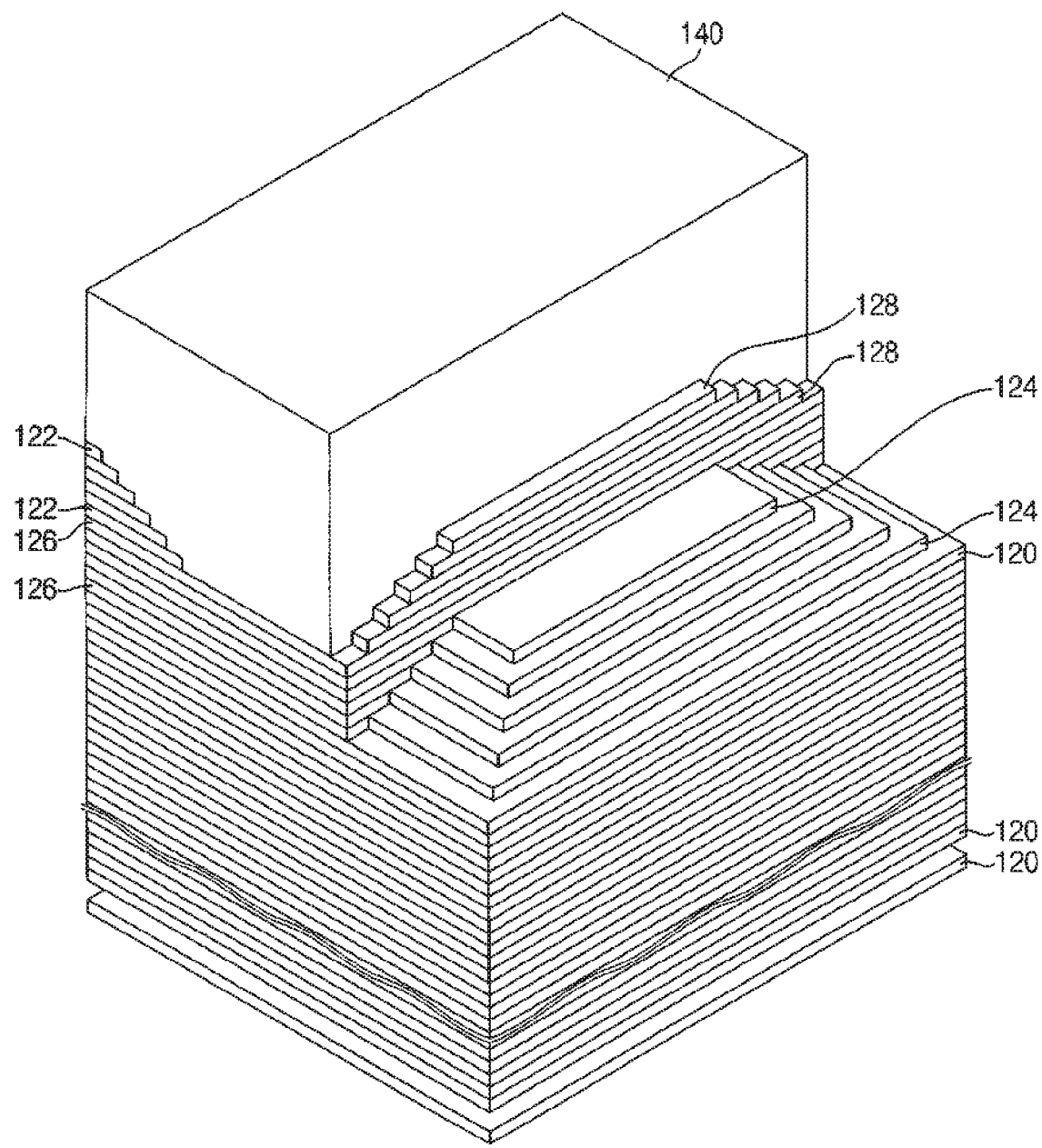

Referring to FIG. 16, a fifth trimming process, in which an area of the fourth photoresist pattern 140 is reduced, may be performed to expose portions of the fourth sacrificial patterns 128.

Figure 17:
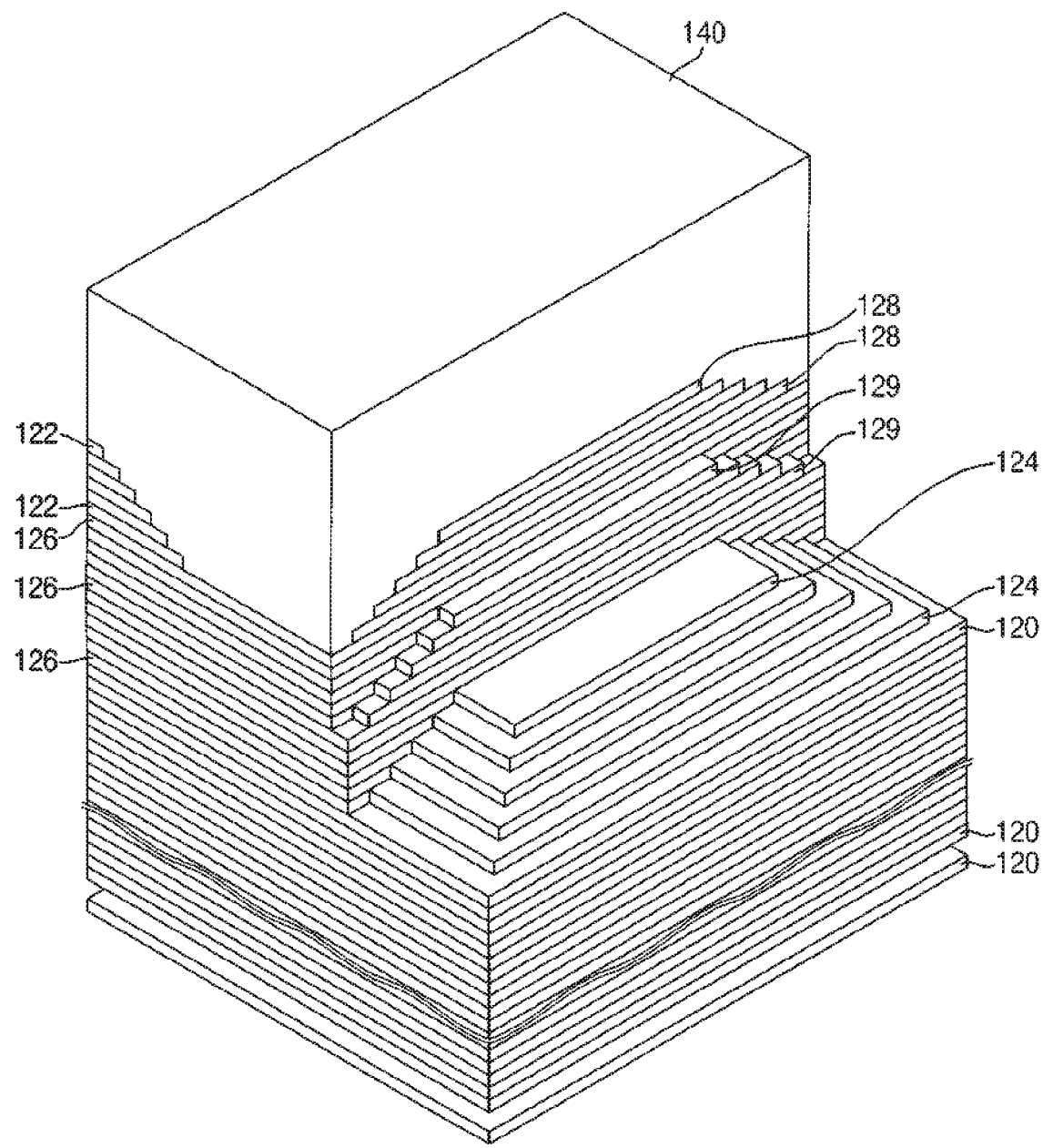

Referring to FIG. 17, the exposed fourth sacrificial patterns 128, the second and third sacrificial patterns 124 and 126, and one or more of the sacrificial layers 120 at thirteenth to eighteenth levels, respectively, may be etched using the fourth photoresist pattern 140 as an etching mask.

Thus, the third sacrificial patterns 126 at the seventh to twelfth levels, respectively, may be reduced to have a length smaller than the previous one, and the third sacrificial patterns 126 may be further formed at the thirteenth to eighteenth levels, respectively, to have a length greater than that of the third sacrificial patterns 126 at the seventh to twelfth levels. The exposed portions of the fourth sacrificial patterns 128 may be moved from the second to sixth levels to the eighth to twelfth levels, respectively, which may be referred to as fifth sacrificial patterns 129, respectively, hereinafter. Portions of the second sacrificial patterns 124 not covered by the fourth photoresist pattern 140 may be moved from the eighth to twelfth levels to the fourteenth to eighteenth levels, respectively.

Processes substantially the same as or similar to those illustrated with reference to FIGS. 16 and 17 may be repeatedly performed.

Figure 18:
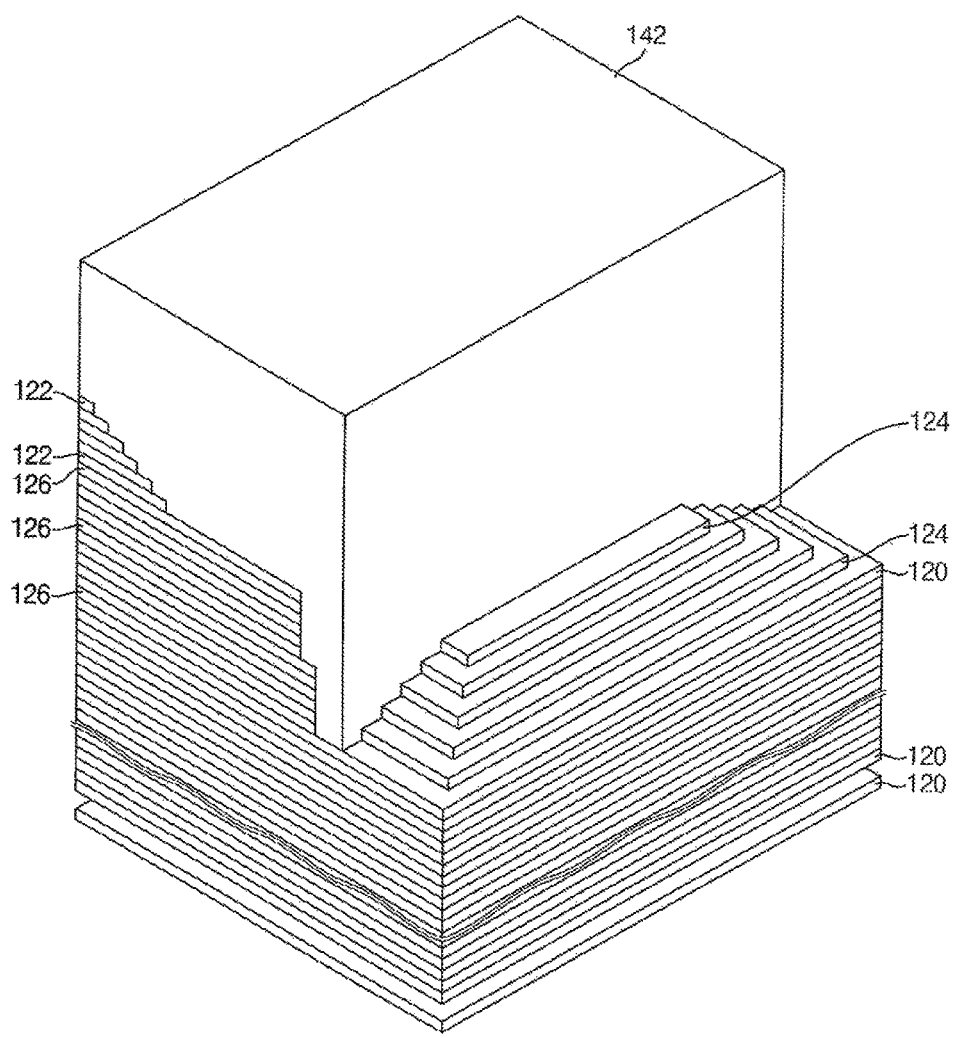
Figure 19:
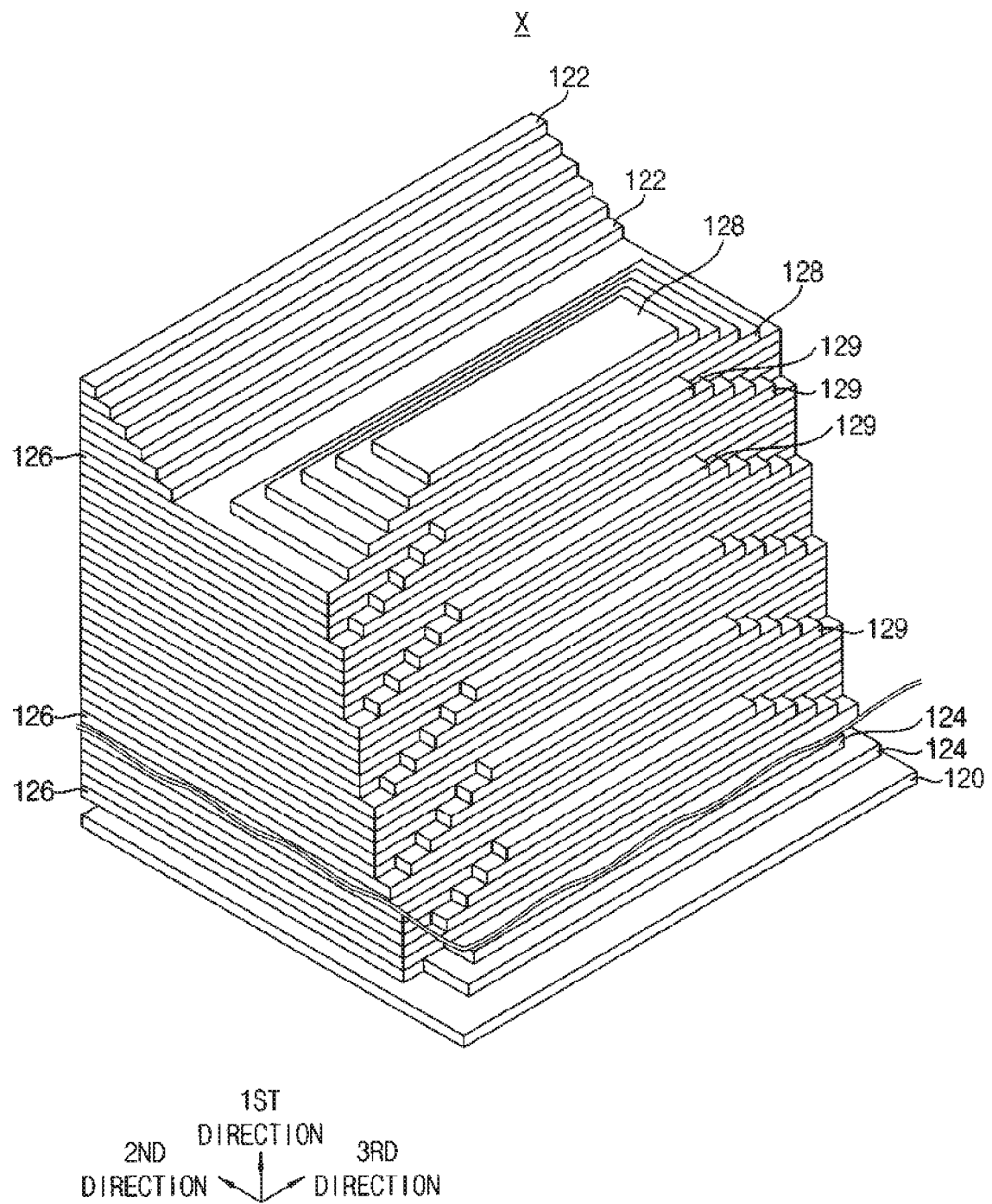

Referring to FIG. 18, after removing the fourth photoresist pattern 140, processes substantially the same as or similar to those illustrated with reference to FIG. 14 may be performed.

For example, a fifth photoresist pattern 142 may be formed on one of the sacrificial layers 120 at a given level to cover the first sacrificial patterns 122, the third to fifth sacrificial patterns 126, 128 and 129, and portions of the second sacrificial patterns 124 adjacent thereto.

Referring to FIGS. 19 to 22, processes substantially the same as or similar to those illustrated with reference to FIGS. 15 to 17 may be repeatedly performed so that the fifth sacrificial patterns 129 may be further formed at desired levels and that stair structures, each of which may include the first to fifth sacrificial patterns 122, 124, 126, 128 and 129, may be formed on the second region II of the substrate 500. The stair structures together with the sacrificial layers 120 remaining on the first region I of the substrate 500 may form a mold.

In exemplary embodiments of the present inventive concept, the first sacrificial patterns 122 may form a third stair structure in which step layers have lengths in the second direction gradually decreasing from a lowermost level toward an uppermost level, and the third sacrificial patterns 126 may form a fourth stair structure in which steps layers have lengths in the second direction decreasing from a lowermost level toward an uppermost level by a unit of several levels, e.g., six levels.

The second sacrificial patterns 124 may form a fifth stair structure in which step layers have lengths in each of the second and third directions gradually decreasing from a lowermost level toward an uppermost level, and the fourth sacrificial patterns 128 may form a sixth stair structure in which step layers have lengths in each of the second and third directions gradually decreasing from a lowermost level toward an uppermost level.

In exemplary embodiments of the present inventive concept, the fifth sacrificial patterns 129 on the third and fourth regions III and IV of the substrate 500 may form seventh and eighth stair structures, respectively, in which step layers have lengths in the third direction gradually decreasing from a lowermost level toward an uppermost level.

The seventh stair structure may include first to sixth step layers sequentially stacked in the first direction, and first to sixth steps of the respective first to sixth steps layers may be sequentially disposed in the third direction in this order. The first to sixth steps may have the first to sixth lengths L1, L2, L3, L4, L5 and L6, respectively, in the third direction. In exemplary embodiments of the present inventive concept, the fifth length L5 may be greater than the fourth and sixth lengths L4 and L6, which may be greater than the first to third lengths L1, L2 and L3. Additionally, the fourth and sixth lengths L4 and L6 may be substantially the same as each other, and the first to third lengths L1, L2 and L3 may be substantially the same as each other.

The seventh and eighth stair structures may be spaced apart from each other in the third direction, and may be symmetric with respect to a straight line extending in the second direction therebetween. Thus, the eighth stair structure may include seventh, eighth, ninth, tenth, eleventh and twelfth step layers sequentially stacked in the first direction from a lowermost level toward an uppermost level, and seventh to twelfth steps of the seventh to twelfth step layers may be sequentially disposed in the third direction in this order.

Figure 23:
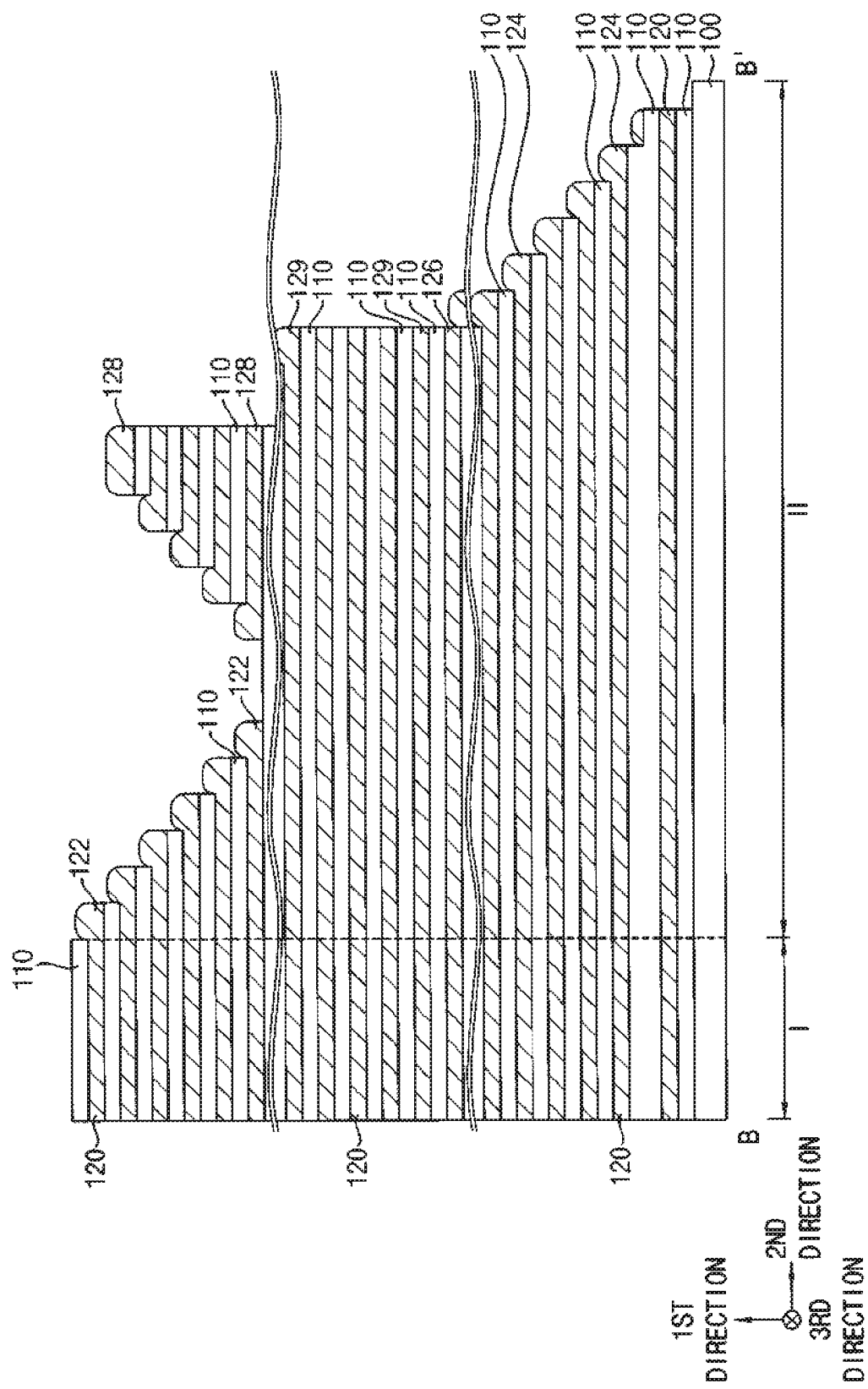

Referring to FIG. 23, thicknesses of end portions in the second direction or the third direction of one or more of the first to fifth sacrificial patterns 122, 124, 126, 128 and 129 on the second region II of the substrate 500 may be increased.

In an exemplary embodiment of the present inventive concept, portions of the insulation layers 110 on steps of the third to eighth stair structures may be removed to expose end portions of the first to fifth sacrificial patterns 122, 124, 126, 128 and 129 of the steps, and a material substantially the same as that of the sacrificial layer 120 may be deposited on the exposed end portions of the first to fifth sacrificial patterns 122, 124, 126, 128 and 129 so that the thicknesses of end portions of the one or more of the first to fifth sacrificial patterns 122, 124, 126, 128 and 129 may be increased. Accordingly, the end portions of the one or more of the first to fifth sacrificial patterns 122, 124, 126, 128 and 129 may have top surfaces that are higher than those of other portions thereof and may have thicknesses that are greater than those of other portions thereof.

Figure 25:
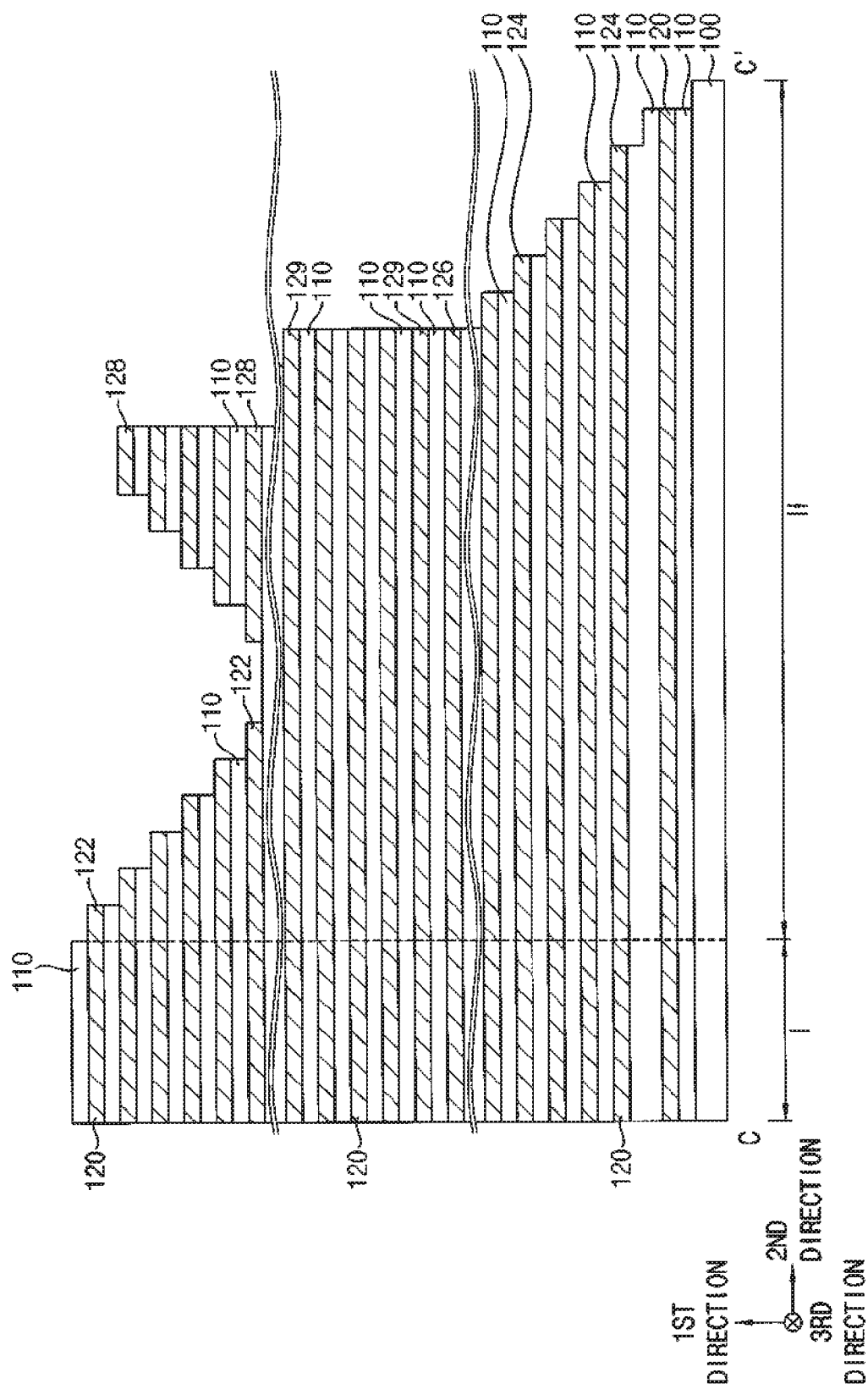

Referring to FIGS. 24 and 25, a first etching mask 170, having a second opening 180 exposing the fifth region V of the substrate 500 and a lowermost one of the sacrificial layers 120, may be formed on the first and second regions I and II of the substrate 500. The thicknesses of the end portions of one or more of the first to fifth sacrificial patterns 122, 124, 126, 128 and 129 on the fifth region V of the substrate 500 and the lowermost one of the sacrificial layers 120 may be decreased.

In exemplary embodiments of the present inventive concept, the increased thicknesses of the end portions of the one or more of the first to fifth sacrificial patterns 122, 124, 126, 128 and 129 illustrated with reference to FIG. 23 may be reduced to the original thicknesses on the fifth region V of the substrate 500 and the lowermost thickness of the sacrificial layers 120.

Figure 26:
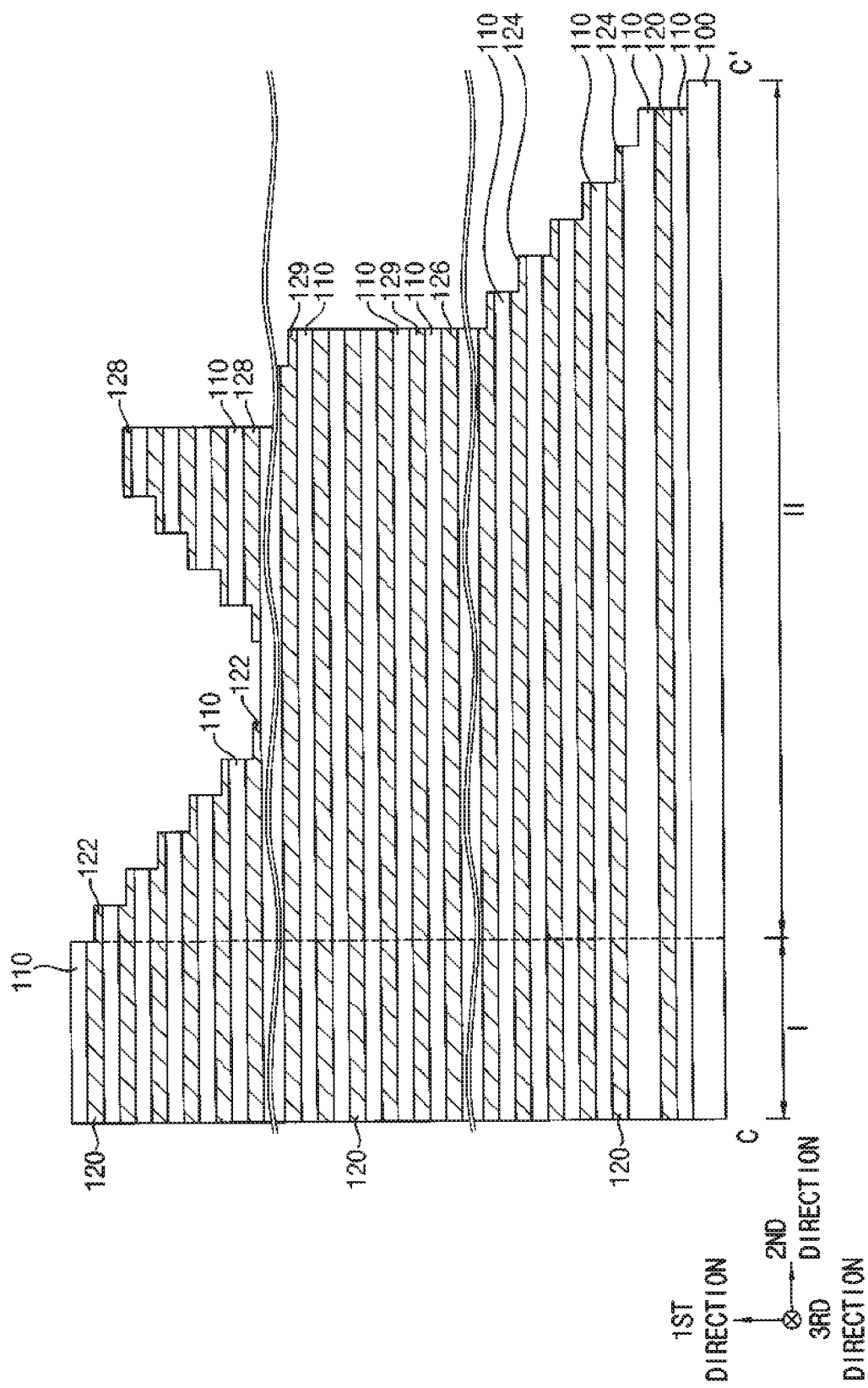

Referring to FIG. 26, the increased thicknesses of the end portions of the one or more of the first to fifth sacrificial patterns 122, 124, 126, 128 and 129 illustrated with reference to FIG. 23 may be reduced to have thicknesses smaller than the original thickness by the etching process illustrated with reference to FIGS. 24 and 25.

Figure 27:
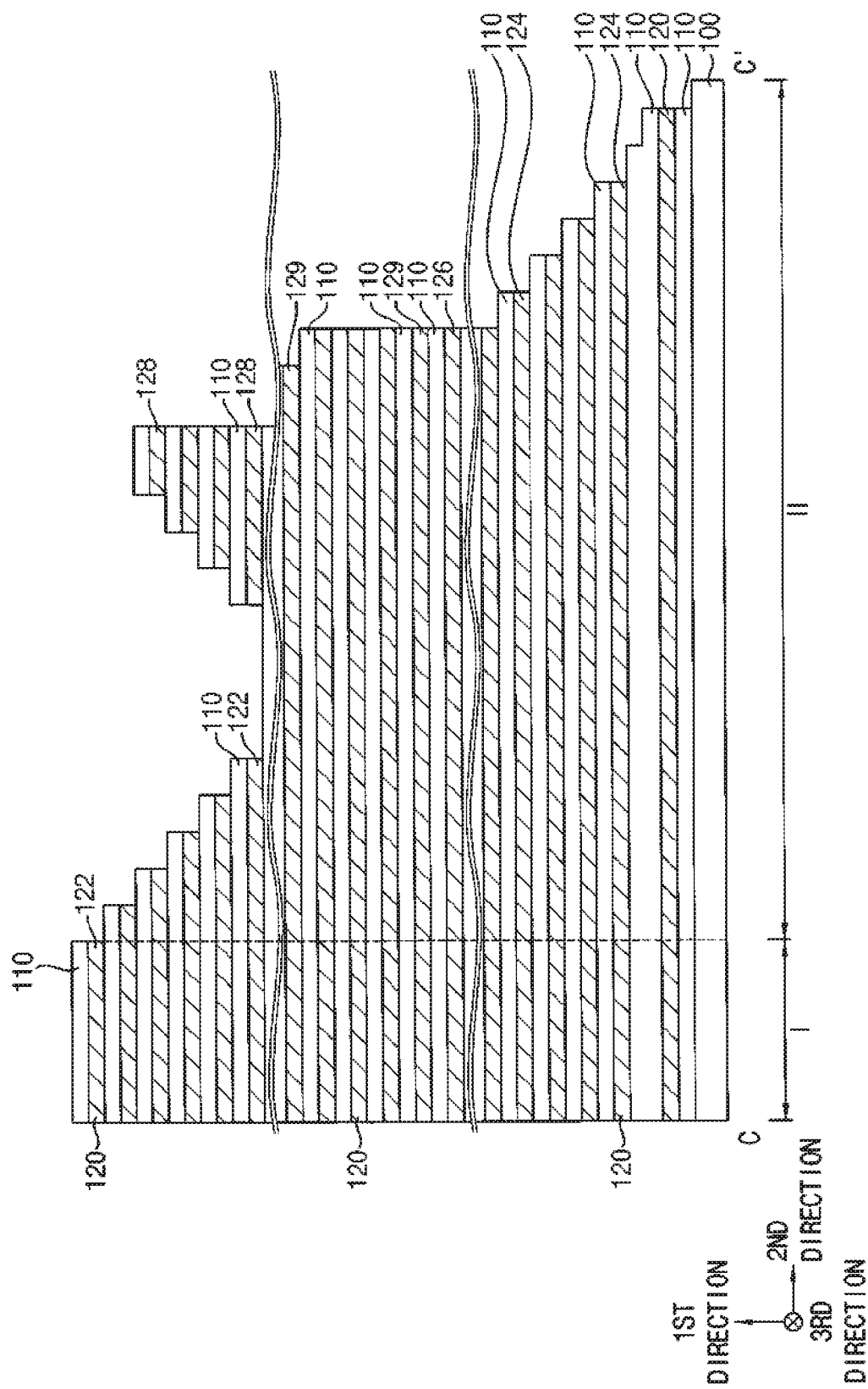

Further, referring to FIG. 27, the end portions of the one or more of the first to fifth sacrificial patterns 122, 124, 126, 128 and 129 illustrated with reference to FIG. 23 may be entirely removed by the etching process illustrated with reference to FIGS. 24 and 25. Thus, an uppermost one of the first sacrificial patterns 122 in the third stair structure, an uppermost one of the second sacrificial pattern 124 in the fourth stair structure, an uppermost one of the fourth sacrificial pattern 128 in the sixth stair structure, and an uppermost one of the fifth sacrificial pattern 129 between the seventh and eighth stair structures may be removed on the fifth region V of the substrate 500.

Figure 28:
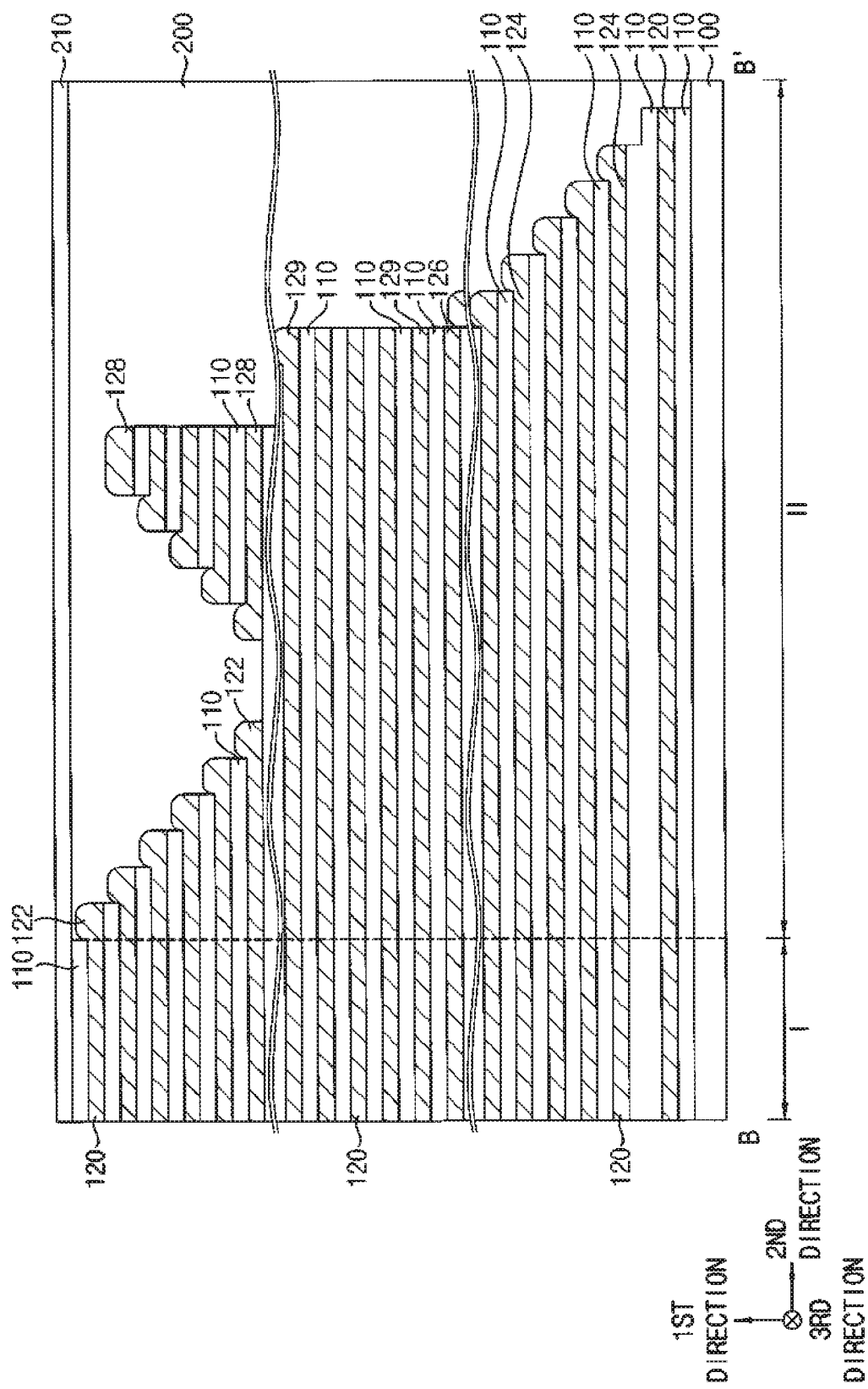

Referring to FIG. 28, a first insulating interlayer 200 may be formed on the substrate 500 to cover the sacrificial layers 120 and the insulation layers 110, which may be alternately and repeatedly stacked on the first region I of the substrate 500 and the mold including the third and eighth stair structures on the second region II of the substrate 500, and may be planarized until an upper surface of an uppermost one of the insulation layers 110 is exposed. The planarization process may include a chemical mechanical polishing (CMP) process and/or an etch back process.

A second insulating interlayer 210 may be formed on the mold and the first insulating interlayer 200. The first and second insulating interlayers 200 and 210 may each include an oxide, e.g., silicon oxide. In an exemplary embodiment of the present inventive concept, the first and second insulating interlayers 200 and 210 may be formed as part of the insulation layer 110.

Figure 29:
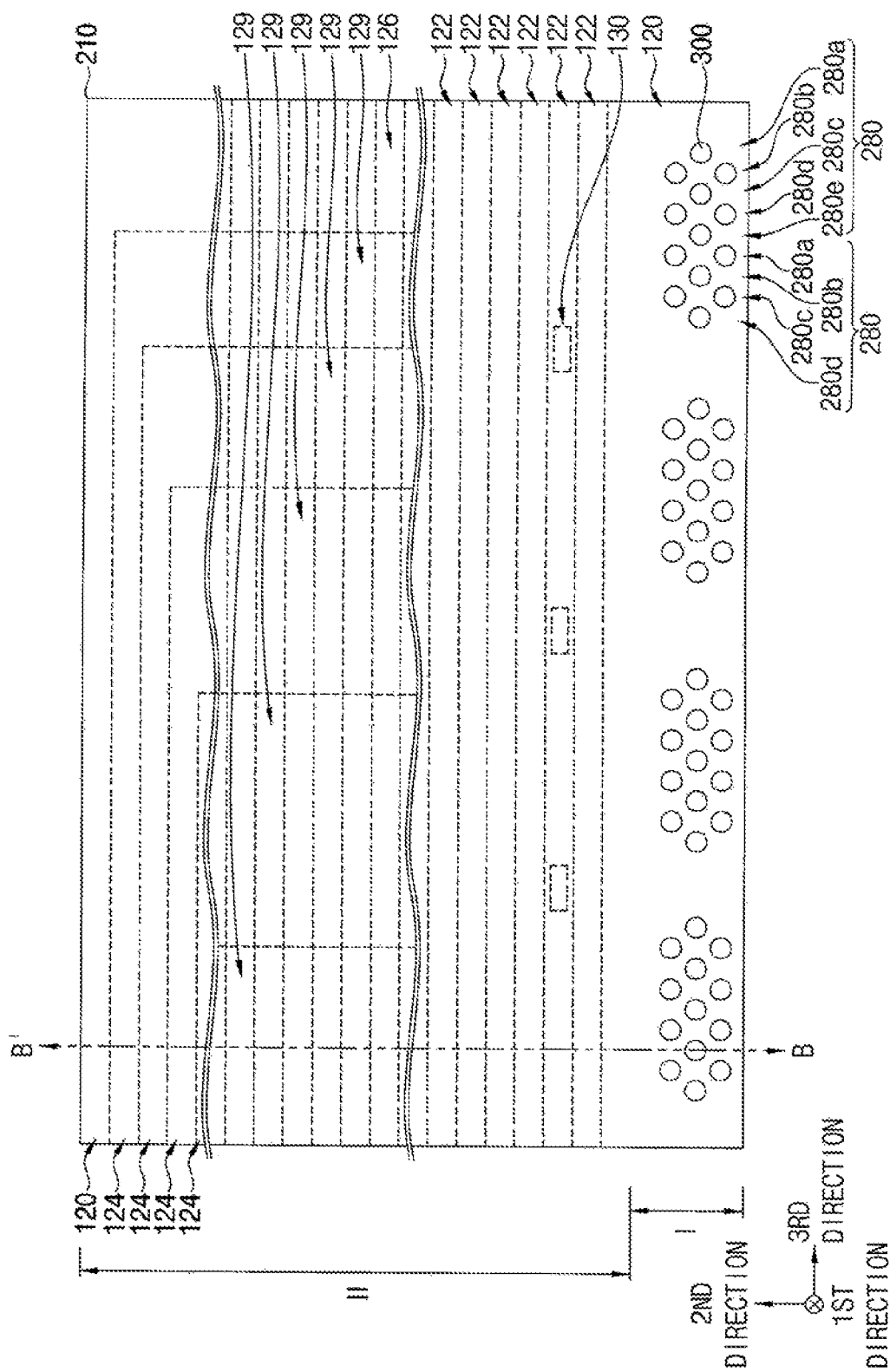
Figure 30:
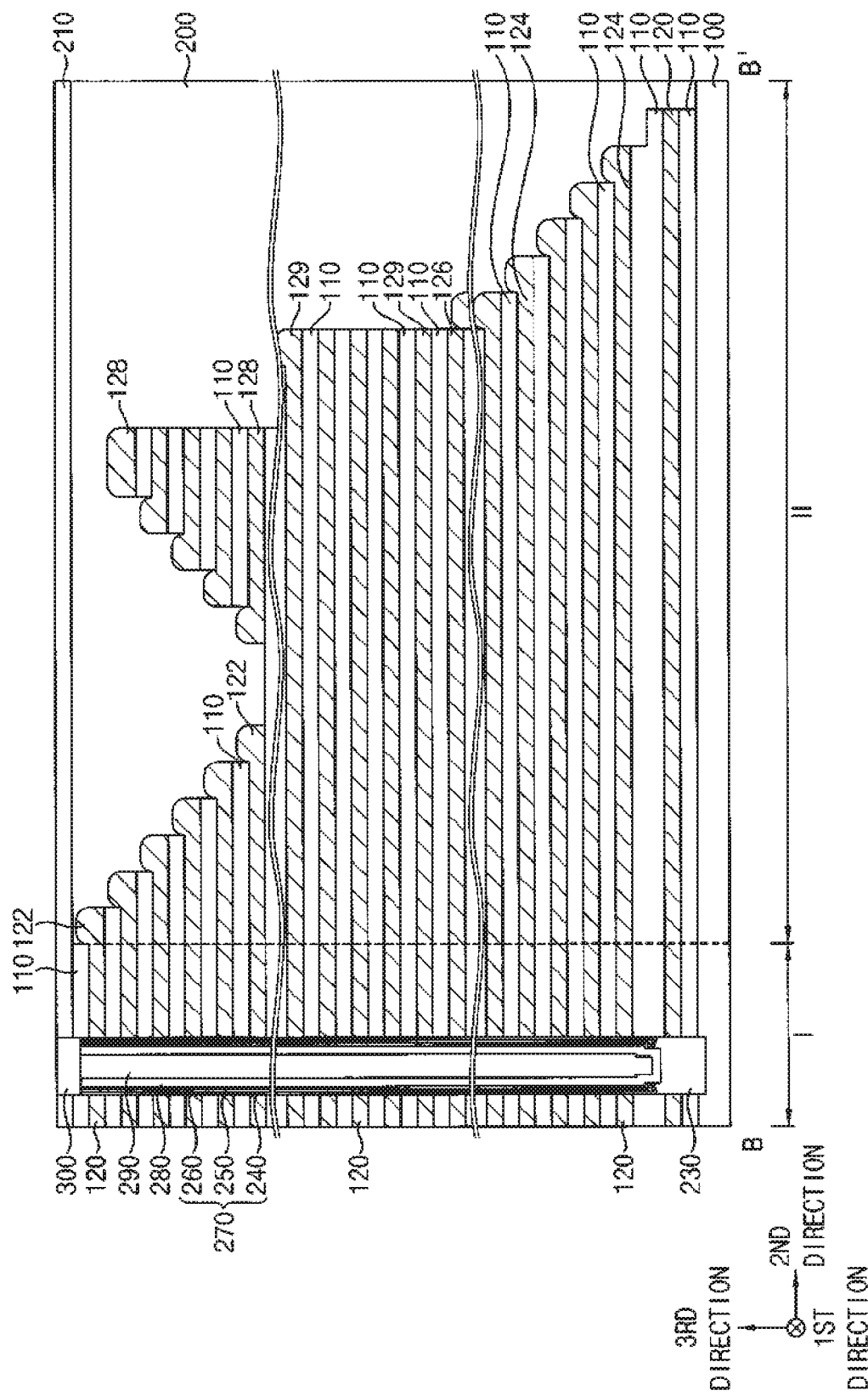

Referring to FIGS. 29 and 30, a second etching mask may be formed on the second insulating interlayer 210. The second insulating interlayer 210, the insulation layers 110, and the sacrificial layers 120 may each be etched using the second etching mask to form a channel hole therethrough exposing an upper surface of the base pattern 100 on the first region I of the substrate 500. A second structure filling the channel hole may be formed by follows.

After removing the second etching mask, a semiconductor pattern 230 may be formed to partially fill the channel hole. For example, a selective epitaxial growth (SEG) process may be performed using the exposed upper portion of the base pattern 100 as a seed to form the semiconductor pattern 230 filling a lower portion of the channel hole. The semiconductor pattern 230 may have an upper surface having a height between those of lower and upper surfaces of one of the insulation layers 110 at a second level upwardly from the upper surface of the base pattern 100.

A first blocking layer, a charge storage layer, a tunnel insulation layer, and a first spacer layer may be sequentially formed on a sidewall of the channel hole, the upper surface of the semiconductor pattern 230 and an upper surface of the second insulating interlayer 210. The first space layer may be anisotropically etched to form a first spacer on the sidewall of the channel hole. The tunnel insulation layer, the charge storage layer, and the first blocking layer may be etched using the first spacer as an etching mask to form a tunnel insulation pattern 260, a charge storage pattern 250, and a first blocking pattern 240, respectively, each having a cup shape of which a bottom is opened on the semiconductor pattern 230 and the sidewall of the channel hole. During the etching process, an upper portion of the semiconductor pattern 230 may also be partially removed. The tunnel insulation pattern 260, the charge storage pattern 250, and the first blocking pattern 240 may together form a charge storage structure 270.

The first spacer and the charge storage pattern 250 may each include a nitride, e.g., silicon nitride. The tunnel insulation pattern 260 and the first blocking pattern 240 may each include an oxide, e.g., silicon oxide.

After removing the first spacer, a channel layer may be formed on the exposed semiconductor pattern 230, the tunnel insulation pattern 260 and the second insulating interlayer 210. A filling layer may be formed on the channel layer to fill a remaining portion of the channel hole. The filling layer and the channel layer may be planarized until the upper surface of the second insulating interlayer 210 may be exposed to form a filling pattern 290. The channel layer may thereby be transformed into a channel 280. The filling pattern 290 may include an oxide, e.g., silicon oxide.

An upper portion of a first structure including the filling pattern 290, the channel 280, and the charge storage structure 270 may be removed to form a trench. A capping pattern 300 may be formed to fill the trench. The channel 280 and the capping pattern 300 may each include polysilicon or a single crystalline silicon that is either not doped or lightly doped with impurities.

In exemplary embodiments of the present inventive concept, a plurality of channels 280 may be formed in each of the second and third directions to form a channel array.

In exemplary embodiments of the present inventive concept, the channel array may include a first channel column 280a including first channels disposed in the second direction, and a second channel column 280b including second channels disposed in the second direction and being spaced apart from the first channel column 280a in the third direction. The first channels, included in the first channel column 280a, may be disposed to have acute angles with the second direction or the third direction from the second channels included in the second channel column 280b. Thus, the first and second channels may be arranged in a zigzag pattern.

The first and second channel columns 280a and 280b may be alternately and repeatedly disposed in the third direction. In exemplary embodiments of the present inventive concept, five first channel columns 280a and four second channel columns 280b may be alternately disposed in the third direction to form a channel block. Hereinafter, four channel columns disposed in the third direction in one channel block may be referred to as first, second, third and fourth channel columns 280a, 280b, 280c and 280d, respectively. One channel column at a central position in the third direction in the channel block may be referred to as a fifth channel column 280e, and the other four channel columns disposed in the third direction in the channel group may be referred to as the first, second, third and fourth channel columns 280a, 280b, 280c and 280d, respectively.

The first to fourth channel columns 280a, 280b, 280c and 280d arranged in the third direction may form a channel group. For example, FIG. 29 shows a channel array including four channel blocks spaced apart from each other in the third direction, and each of the channel blocks includes two channel groups arranged in the third direction and the fifth channel column 280e is disposed between the two channel groups. However, the number of the channel columns included in each channel block or the number of the channels included in each channel group might not be limited to the above. The channels 270 of the fifth channel column 280e may be dummy channels.

Figure 31:
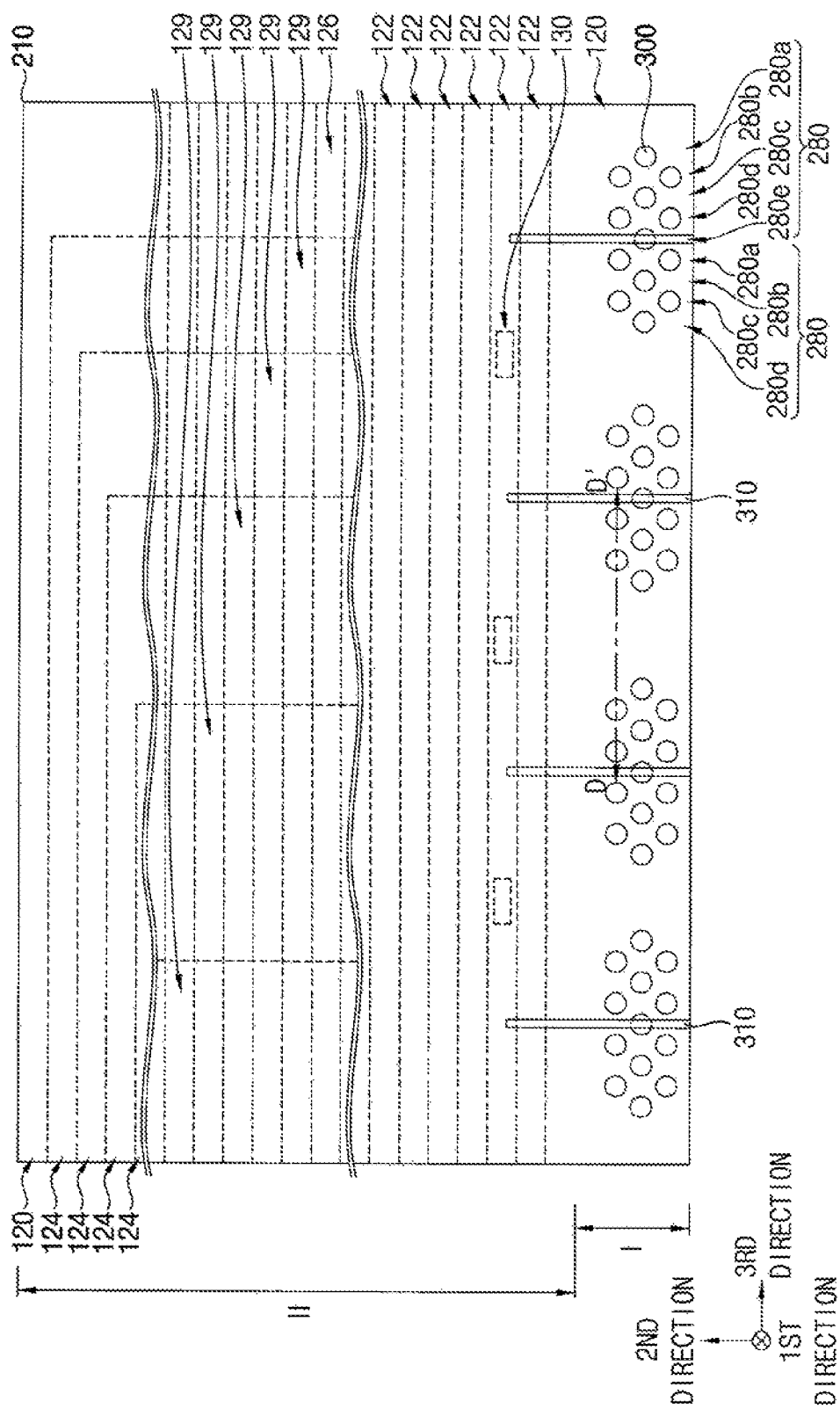
Figure 32:
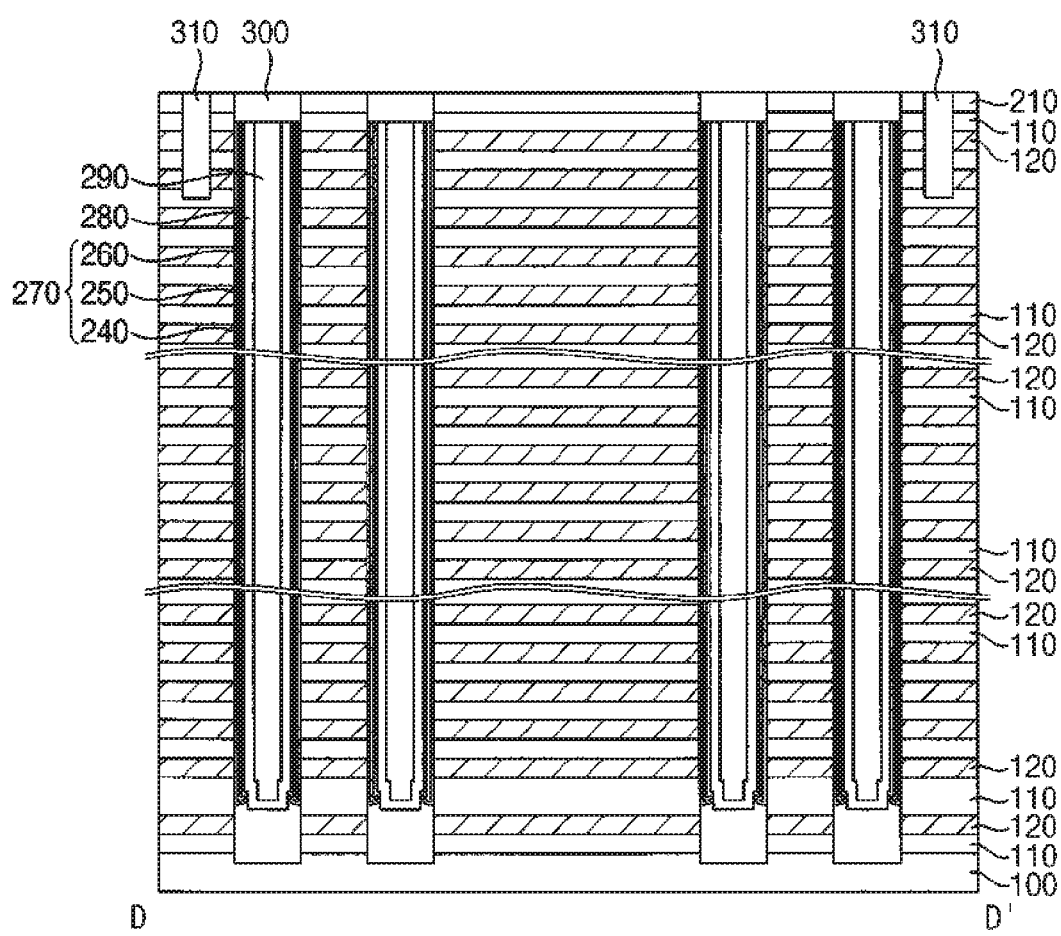

Referring to FIGS. 31 and 32, a second division pattern 310 may be formed through one or more of the sacrificial layers 120 and the insulation layers 110 on the first region I of the substrate 500 and a portion of the second region II of the substrate 500 adjacent thereto.

The second division pattern 310 may be formed by forming a third etching mask on the second insulating interlayer 210, etching the second insulating interlayer 210, etching one or more of the insulation layers 110 and the sacrificial layers 120 using the third etching mask to form a third opening therethrough, and filling an insulating material.

In exemplary embodiments of the present inventive concept, the second division pattern 310 may extend in the second direction between two channel groups in a channel block. Thus, the second division pattern 310 may extend through an upper portion of the channel 280 included in the fifth channel column 280e.

In exemplary embodiments of the present inventive concept, the second division pattern 310 may extend, not only through the upper portion of the channel 280, but also through the second insulating interlayer 210, one or more of the sacrificial layers 120 at upper two levels, and one or more of the insulation layers 110 at upper two levels, and further may extend through a portion of one of the insulation layer 110 at a third level from above. The second division pattern 310 may extend in the second direction, not only on the first region I of the substrate 500, but also on the second region II of the substrate 500 so as to penetrate through upper step layers of the third stair structure. Accordingly, the sacrificial layers 120 and the first sacrificial patterns 122 at upper two levels may be divided in the third direction by the second division pattern 310.

Figure 33:
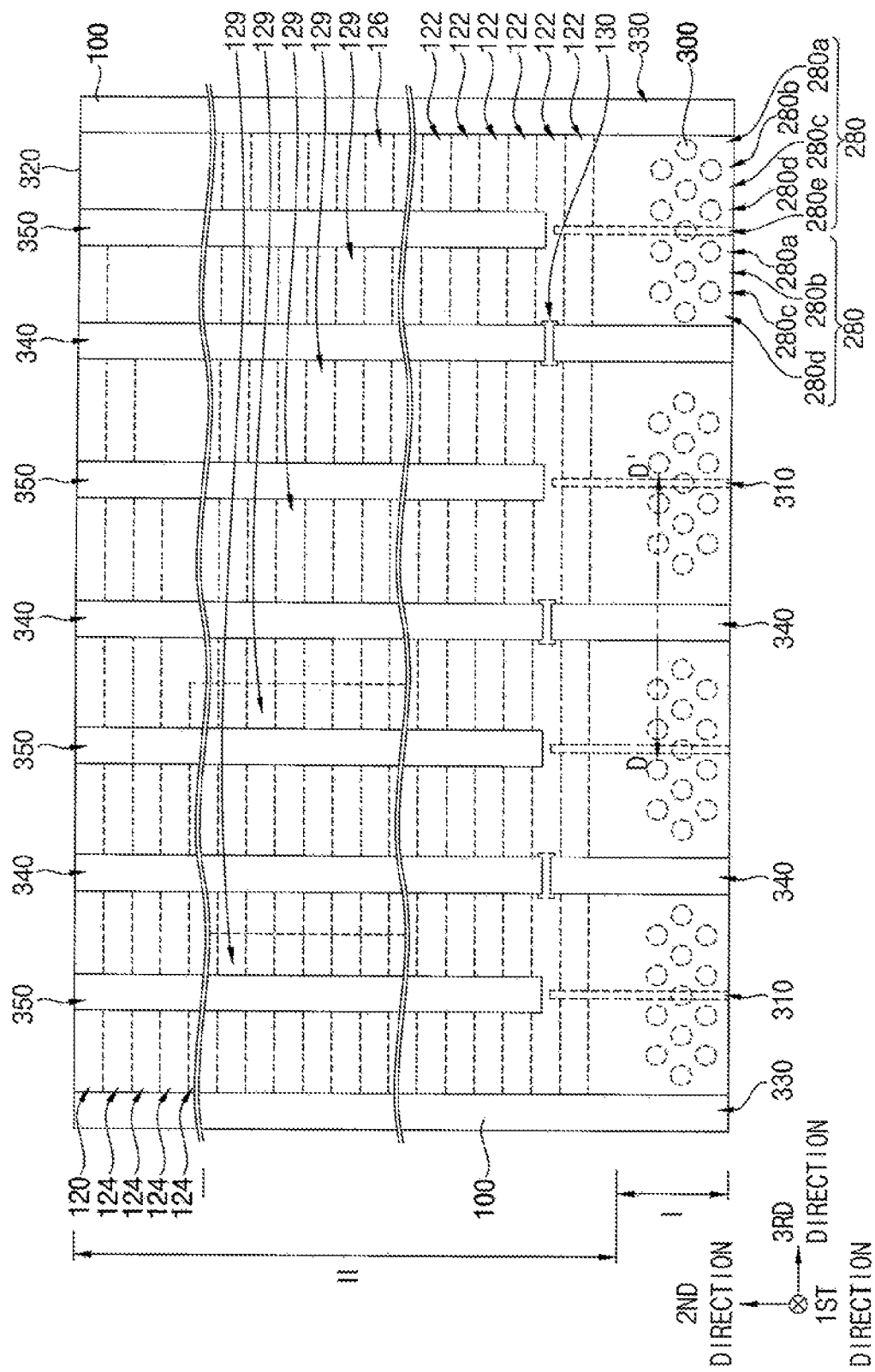

Referring to FIGS. 33 and 34, a third insulating interlayer 320 may be formed on the second insulating interlayer 210, the capping pattern 300 and the second division pattern 310, a fourth etching mask may be formed on the third insulating interlayer 320, and the second and third insulating interlayers 210 and 320, the insulation layers 110 and the sacrificial layers 120 may be etched using the fourth etching mask to form fourth and fifth openings 330 and 340 therethrough exposing an upper surface of the base pattern 100.

In exemplary embodiments of the present inventive concept, each of the fourth and fifth openings 330 and 340 may extend in the second direction between the channel blocks on the first and second regions I and II of the substrate 500. A plurality of fourth openings 330 and a plurality of fifth openings 340 may be formed in the third direction. For example, one channel block may be disposed between neighboring examples of the fourth and fifth openings 330 and 340, and the channel block may be disposed at each of opposite sides of the fifth channel column 280e to include two channel groups each including four channel columns.

As the fourth and fifth openings 330 and 340 are formed, the sacrificial layer 120 may be divided into a plurality of pieces, each of which may extend in the second direction, and the insulation layer 110 may be transformed into insulation patterns 115, each of which may extend in the second direction.

In exemplary embodiments of the present inventive concept, the fourth opening 330 may continuously extend on the first and second regions I and II of the substrate 500, however, the fifth opening 340 may be blocked on the second region II of the substrate 500. Thus, the sacrificial layers 120 extending in the second direction at each of opposite sides of the fifth opening 340 in the third direction may be connected with each other on the second region II of the substrate 500. In exemplary embodiments of the present inventive concept, a connecting portion that may connect the sacrificial layers 120 with each other may overlap in the first direction one of the first sacrificial patterns 122 at the third level included in the third stair structure and the first division pattern 130.

In exemplary embodiments of the present inventive concept, the fourth opening 330 may overlap each of opposite edges of the region X, and thus four channel blocks may be disposed between neighboring examples of the fourth openings 330 in the third direction. Additionally, the fifth opening 340 may be formed between the channel blocks in the region X, and thus one channel block may be formed between neighboring examples of the fifth openings 340 in the third direction. As a result, four sacrificial layers 120 each extending in the second direction in the region X may be connected with each other by the connecting portions. However, one or more of the sacrificial layers 120 at a lowermost level may be divided from each other by the first division pattern 130.

In exemplary embodiments of the present inventive concept, when the fourth and fifth openings 330 and 340 are formed, a sixth opening 350 may also be formed to extend through the second and third insulating interlayers 210 and 320, the insulation layers 110, and the first to fifth sacrificial patterns 122, 124, 126, 128 and 129 to expose an upper surface of the base pattern 100.

The sixth opening 350 may extend in the second direction on the second region II of the substrate 500 to divide each of the first to fifth sacrificial patterns 122, 124, 126, 128 and 129 in the third direction. In a plan view, the sixth opening 350 may extend from one of the first sacrificial patterns 122 included in the third stair structure to an end of the second region II of the substrate 500.

Figure 36:
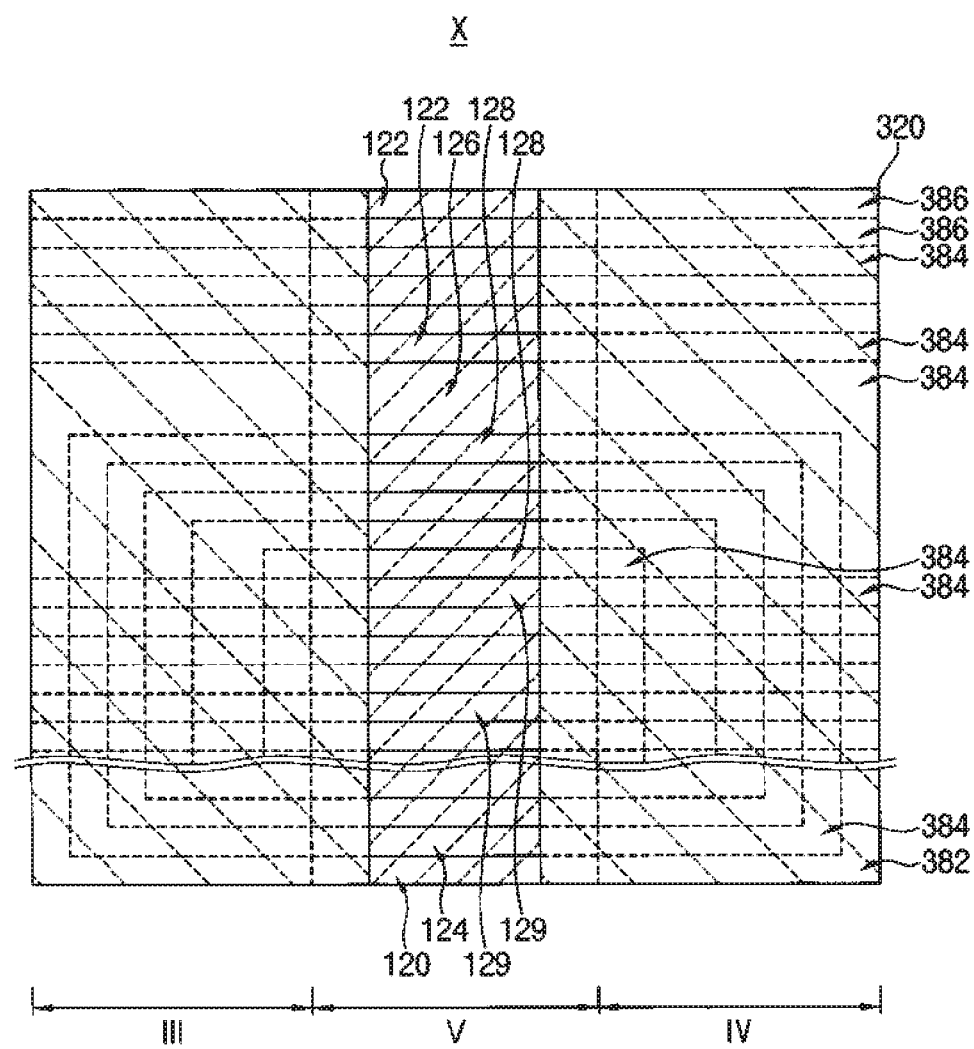

Referring to FIGS. 35 and 36, after removing the fourth etching mask, the sacrificial layers 120 and the first to fifth sacrificial patterns 122, 124, 126, 128 and 129 exposed by the fourth to sixth openings 330, 340 and 350 may be removed to form a gap between neighboring examples of the insulation patterns 114 in the first direction. A portion of a sidewall of the second division pattern 310, a portion of an outer sidewall of the first blocking pattern 240, and a portion of a sidewall of the semiconductor pattern 230 may accordingly be exposed.

A second blocking layer 370 may be formed on the exposed portion of the sidewall of the second division pattern 310, the exposed portion of the outer sidewall of the first blocking pattern 240, the exposed portion of the sidewall of the semiconductor pattern 230, an inner wall of the gap, surfaces of the insulation patterns 115, an upper surface of the base pattern 100, and an upper surface of the third insulating interlayer 320. A gate conductive layer may be formed on the second blocking layer 370 to fill a remaining portion of the gap. A gate barrier layer may be further formed between the second blocking layer 370 and the gate conductive layer.

The second blocking layer 370 may include a metal oxide, e.g., aluminum oxide, the gate conductive layer may include a metal, e.g., tungsten, and the gate barrier layer may include a metal nitride, e.g., titanium nitride, tantalum nitride, etc.

The gate conductive layer may be partially removed to form a gate conductive pattern in the gap, and when the gate barrier layer is formed, the gate barrier layer may be partially removed to form a gate barrier pattern. The gate conductive pattern and the gate barrier pattern may form a gate electrode.

In exemplary embodiments of the present inventive concept, the gate electrode may extend in the second direction, and a plurality of gate electrodes may be formed in the first direction. Additionally, a plurality of gate electrodes may also be formed in the third direction. For example, the gate electrodes may be spaced apart from each other in the third direction by the fourth opening 330. Additionally, each gate electrode may be divided into pieces in the third direction by the fifth opening 340, which may be connected to each other by the connecting portion, which may be formed on the second region II of the substrate 500 to overlap the first division pattern 130. Each of the gate electrodes extending in the second direction on the second region II of the substrate 500, except for those at the upper two levels, may also be divided in the third direction by the sixth opening 350.

The gate electrode may include first to third gate electrodes 382, 384 and 386 sequentially stacked in the first direction. In exemplary embodiments of the present inventive concept, the first gate electrode 382 may be formed at a lowermost level, the third gate electrode 386 may be formed at upper two levels, and the second gate electrode 384 may be formed at a plurality levels between the first and third gate electrodes 382 and 386.

The gate electrodes may be formed by replacing the first to fifth sacrificial patterns 122, 124, 126, 128 and 129 of the third to eighth stair structures on the second region II of the substrate 500, and thus the third to eighth stair structures may include the gate electrodes.

As illustrated above, the end portions of the first to fifth sacrificial patterns 122, 124, 126, 128 and 129 on the fifth region V of the substrate 500 may have thicknesses smaller than those of the end portions of the first to fifth sacrificial patterns 122, 124, 126, 128 and 129 on the third and fourth regions III and IV of the substrate 500. Thus, when the gap is formed by removing the sacrificial layers 120 and the first to fifth sacrificial patterns 122, 124, 126, 128 and 129 exposed by the fourth to sixth openings 330, 340 and 350, the removal ratio of the first to fifth sacrificial patterns 122, 124, 126, 128 and 129 on the fifth region V of the substrate 500 may be less than that of the first to fifth sacrificial patterns 122, 124, 126, 128 and 129 on the third and fourth regions III and IV of the substrate 500, which might not be entirely removed but may at least partially remain. As shown in FIG. 36, both edge portions of the first to fifth sacrificial patterns 122, 124, 126, 128 and 129 on the fifth region V of the substrate 500 may be removed to be replaced with the gate electrodes, however, central portions thereof might not be removed and may at least partially remain as a mold.

Figure 37:
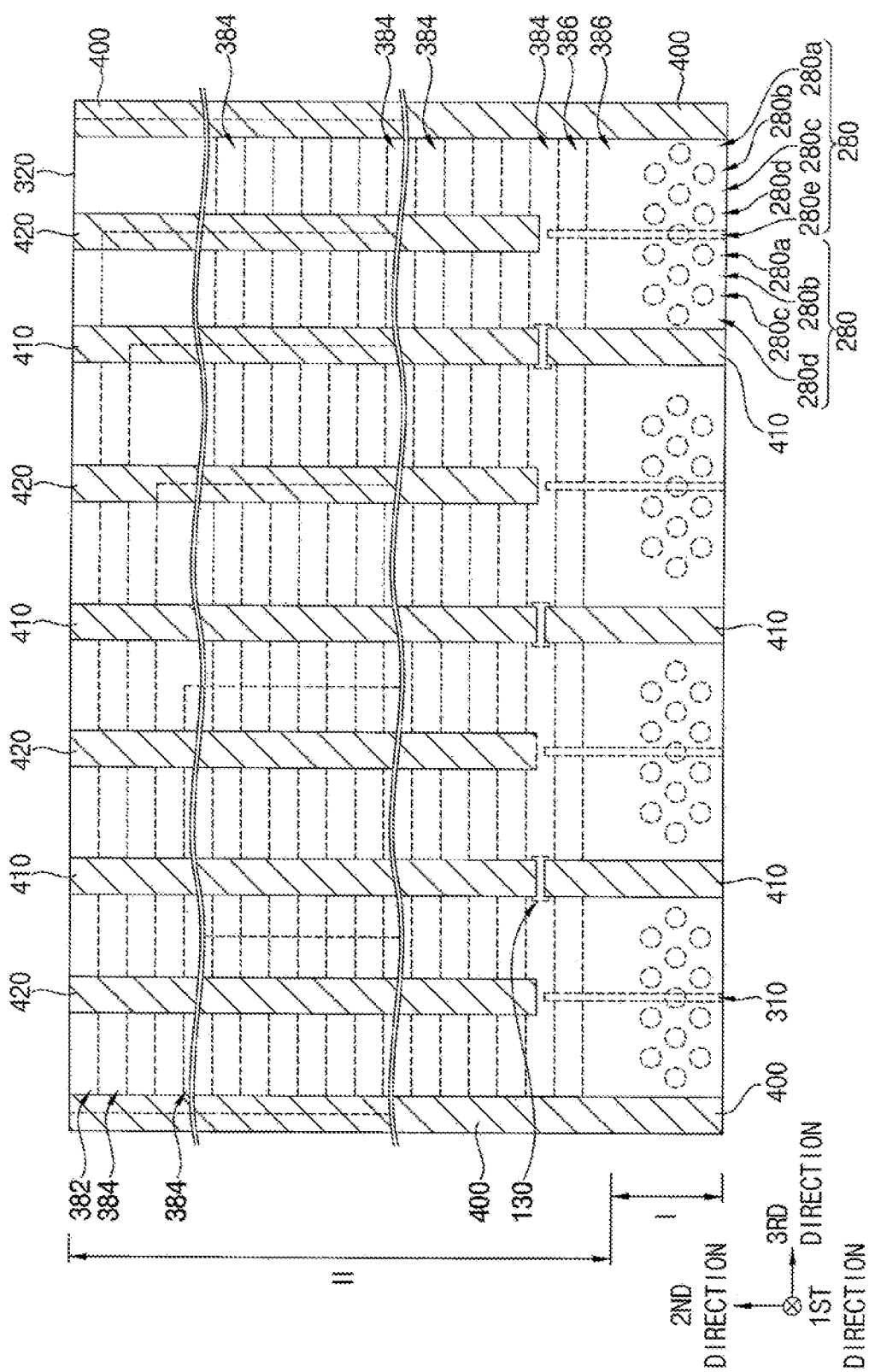
Figure 38:
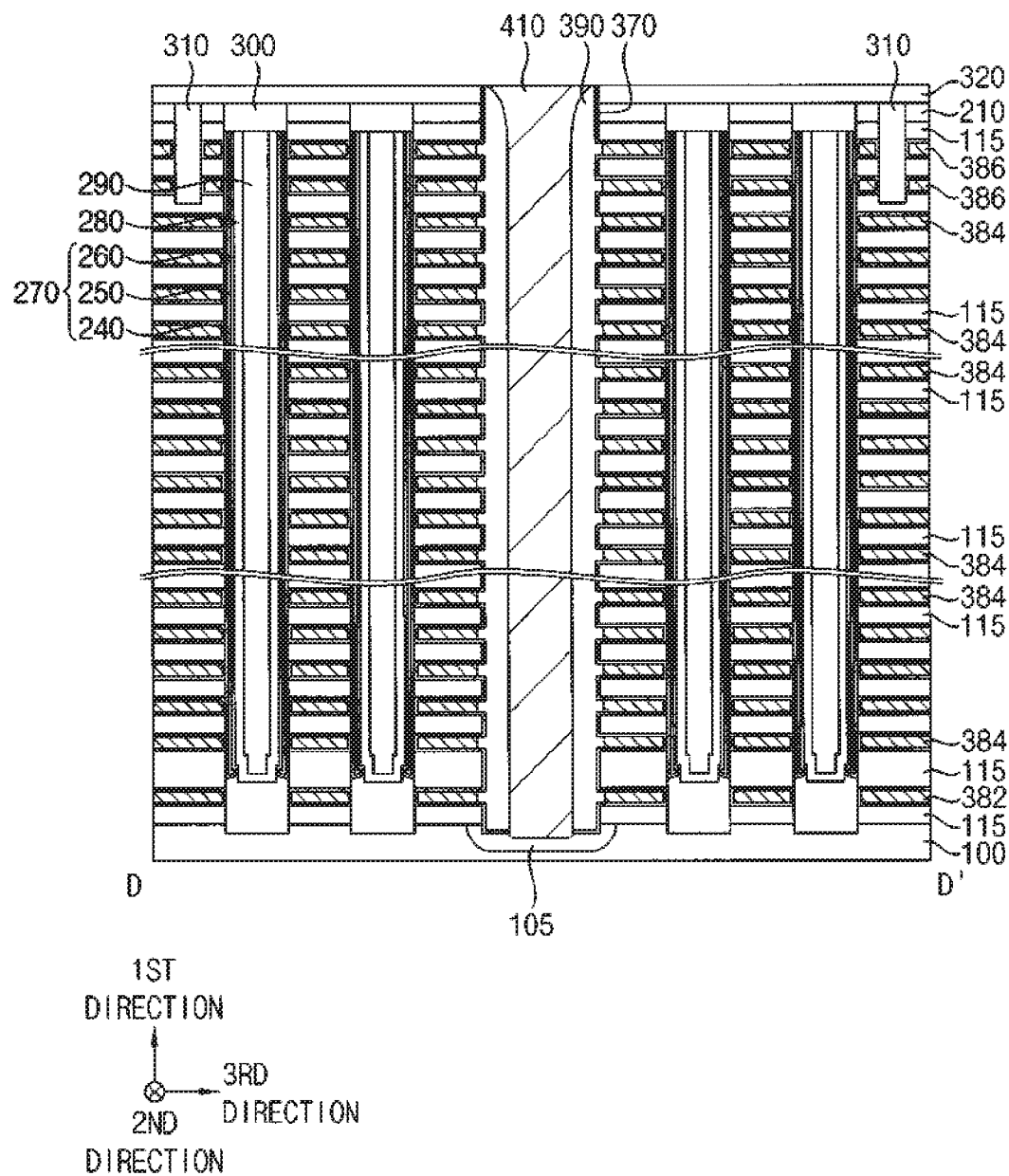

Referring to FIGS. 37 and 38, impurities may be implanted into upper portions of the base pattern 100 exposed by the fourth and fifth openings 330 and 340 to form a second impurity region 105.

A second spacer layer may be formed on the upper surface of the base pattern 100 exposed by the fourth to sixth openings 330, 340 and 350, sidewalls of the fourth to sixth openings 330, 340 and 350, and the upper surface of the third insulating interlayer 320, and may be anisotropically etched to form a second spacer 390 on each of the sidewalls of the fourth to sixth openings 330, 340 and 350.

First and second common source lines (CSLs) 400 and 410 may be formed in the fourth and fifth openings 330 and 340, respectively, on the second impurity region 105, and a third division pattern 420 may be formed in the sixth opening 350 on the base pattern 100.

In exemplary embodiments of the present inventive concept, a conductive layer may be formed on the exposed upper surface of the base pattern 100, the second spacer 390 and the third insulating interlayer 320 to fill the fourth to sixth openings 330, 340 and 350, and may be planarized until the upper surface of the third insulating interlayer 320 may be exposed to form the first and second CSLs 400 and 410 and the third division pattern 420. During the planarization process, a portion of the second blocking layer 370 on the third insulating interlayer 320 may also be removed. The first and second CSLs 400 and 410 may be formed in the fourth and fifth openings 330 and 340, respectively, to contact an upper surface of the second impurity region 105.

Referring to FIGS. 39 to 42, after forming a fourth insulating interlayer 430 on the third insulating interlayer 320, the first and second CSLs 400 and 410, the third division pattern 420, the second spacer 390, and the second blocking layer 370, contact plugs 440 may be formed through the first to fourth insulating interlayers 200, 210, 320 and 430, the insulation patterns 115 and the second blocking layer 370 on the third and fourth regions III and IV of the substrate 500 to contact upper surfaces of the first to third gate electrodes 382, 384 and 386. Through vias 450 may be formed through the first to fourth insulating interlayers 200, 210, 320 and 430, the insulation patterns 115, the sacrificial layers 120, the base pattern 100 and the second lower insulating interlayer 630 to contact upper surfaces of the third wirings 620 on the fifth region V of the substrate 500.

Each of the contact plugs 440 may contact an upper surface of at least one of the steps included in the third to eighth stair structures. For example, the contact plugs 440 may contact upper surfaces of the steps of the seventh stair structure to be arranged in the third direction. Additionally, the contact plugs 440 may contact upper surfaces of the steps of the seventh stair structure, which may be arranged in the second direction, to be arranged in the second direction.

The through vias 450 may be formed in the third direction between the seventh and eighth stair structures. For example, six through vias 450 may be formed between the seventh and eighth stair structures.

The contact plugs 440 and the through vias 450 may include a metal and/or a metal nitride. Upper wirings and more vias may be further formed to complete the fabrication of the vertical memory device.

The vertical memory device manufactured by the above processes may include the gate electrodes 382, 384 and 386 spaced apart from each other in each of the first and third directions on the substrate 500 including the first and second regions I and II, and the channel 280 extending through one or more of the gate electrodes 382, 384 and 386 in the first direction on the first region I of the substrate 500. End portions in the second direction of one or more of the gate electrodes 382, 384 and 386 on the second region II of the substrate 500 may form the seventh and eighth stair structures. The seventh stair structure may include first to sixth steps sequentially stacked in the first direction from a lowermost step toward an uppermost step and also arranged in the third direction, and the eighth stair structure may include seventh to twelfth steps corresponding thereto. The seventh and eighth stair structures may be formed on the third and fourth regions III and IV, respectively, of the substrate 500. In exemplary embodiments of the present inventive concept, the first to sixth steps may have the first to sixth lengths L1, L2, L3, L4, L5 and L6, respectively, and the fifth length L5 may be greater than the fourth and sixth lengths L4 and L6, which may be greater than the first to third lengths L1, L2 and L3. In an exemplary embodiment of the present inventive concept, the fourth and sixth lengths L4 and L6 may be substantially the same as each other, and the first to third lengths L1, L2 and L3 may be substantially the same as each other. However, portions of the gate electrodes 382, 384 and 386 may remain on the fifth region V of the substrate 500, and thus, if the portions thereof are included, the sixth step may have a seventh length L7 greater than the fifth length L5.

In exemplary embodiments of the present inventive concept, a plurality of seventh stair structures may be formed in the second direction at different heights, and a plurality of eighth stair structures may be formed in the second direction at different heights. In exemplary embodiments of the present inventive concept, a mold including the insulation patterns 115 and the fifth sacrificial patterns 129, alternately and repeatedly stacked in the first direction, may remain between the seventh and eighth stair structures and contact sidewalls of the seventh and eighth stair structures. The fifth sacrificial patterns 129 may have lower surfaces substantially coplanar with lower surfaces of corresponding steps of each of the seventh and eighth stair structures, and may have upper surfaces that are lower than upper surfaces thereof. In exemplary embodiments of the present inventive concept, the seventh and eighth stair structures may be symmetric with respect to the mold.

In exemplary embodiments of the present inventive concept, the contact plug 440 may be formed on each of the first to sixth steps of the seventh stair structure. Distances in the third direction between the contact plugs 440 on the first to sixth steps, respectively, may be first, second, third, fourth and fifth distances D1, D2, D3, D4 and D5, and the fourth and fifth distances D4 and D5 may be greater than he first to third distances D1, D2 and D3. In an exemplary embodiment of the present inventive concept, the fourth and fifth distances D4 and D5 may be substantially the same as each other, and the first to third distances D1 to D3 may be substantially the same as each other.

In exemplary embodiments of the present inventive concept, the vertical memory device may include the circuit pattern on the substrate 500 and the base pattern 100 over the circuit pattern. The gate electrodes 382, 384 and 386, the channel 280 and the mold may be formed on the base pattern 100. The through via 450 may extend through the mold and the base pattern 100 to be electrically connected to the circuit pattern. Accordingly, a plurality of through vias 450 may be formed.

In exemplary embodiments of the present inventive concept, each of the first and second CSLs 400 and 410 may extend in the second direction to divide each of the gate electrodes 382, 384 and 386 in the third direction. The first CSL 400 may continuously extend in the second direction on the first and second regions I and II of the substrate 500. The second CSL 410 may extend in the second direction on the first and second regions I and II of the substrate 500, however, they may be cut on the second region II of the substrate 500.

In exemplary embodiments of the present inventive concept, the first CSLs 400 may contact a sidewall of the first step or penetrate through the sixth step. The second CSLs 410 may be formed between the first CSLs 400 to contact a sidewall of the third step, penetrate through the fourth step, or penetrate through the fifth step.

In exemplary embodiments of the present inventive concept, the vertical memory device may further include the third division patterns 420 each extending in the second direction between neighboring examples of the first and second CSLs 400 and 410 to divide each of the gate electrodes 382, 384 and 386 in the third direction. The third division patterns 420 may contact a sidewall of the second step, contact a sidewall of the fourth step, penetrate through the fifth step, or penetrate through the sixth step.

In exemplary embodiments of the present inventive concept, among first to sixth step layers of the seventh stair structure, each of the first and second step layers may be formed by end portions of four second gate electrodes 384 in the third direction. Each of the third and fourth step layers may be formed by end portions of three second gate electrodes 384 in the third direction. The fifth step layer may be formed by end portions of two second gate electrodes 384 in the third direction. The sixth step layer may be formed by one second gate electrode 384.

In exemplary embodiments of the present inventive concept, the first to sixth step layers may include the first to sixth steps, and at least one of the first to sixth steps may have a length in the third direction different from those of the first to sixth steps.

The vertical memory device may include the seventh and eighth stair structures each of which may include a plurality of steps, e.g., six steps in the third direction, and thus, even if a lot of gate electrodes are stacked in the first direction, the length of the vertical memory device in the second direction might not increase very much. Additionally, the length in the third direction of the steps of the step layers may be properly adjusted so that only one contact plug 440 may be formed on each of the steps.

Figure 39:
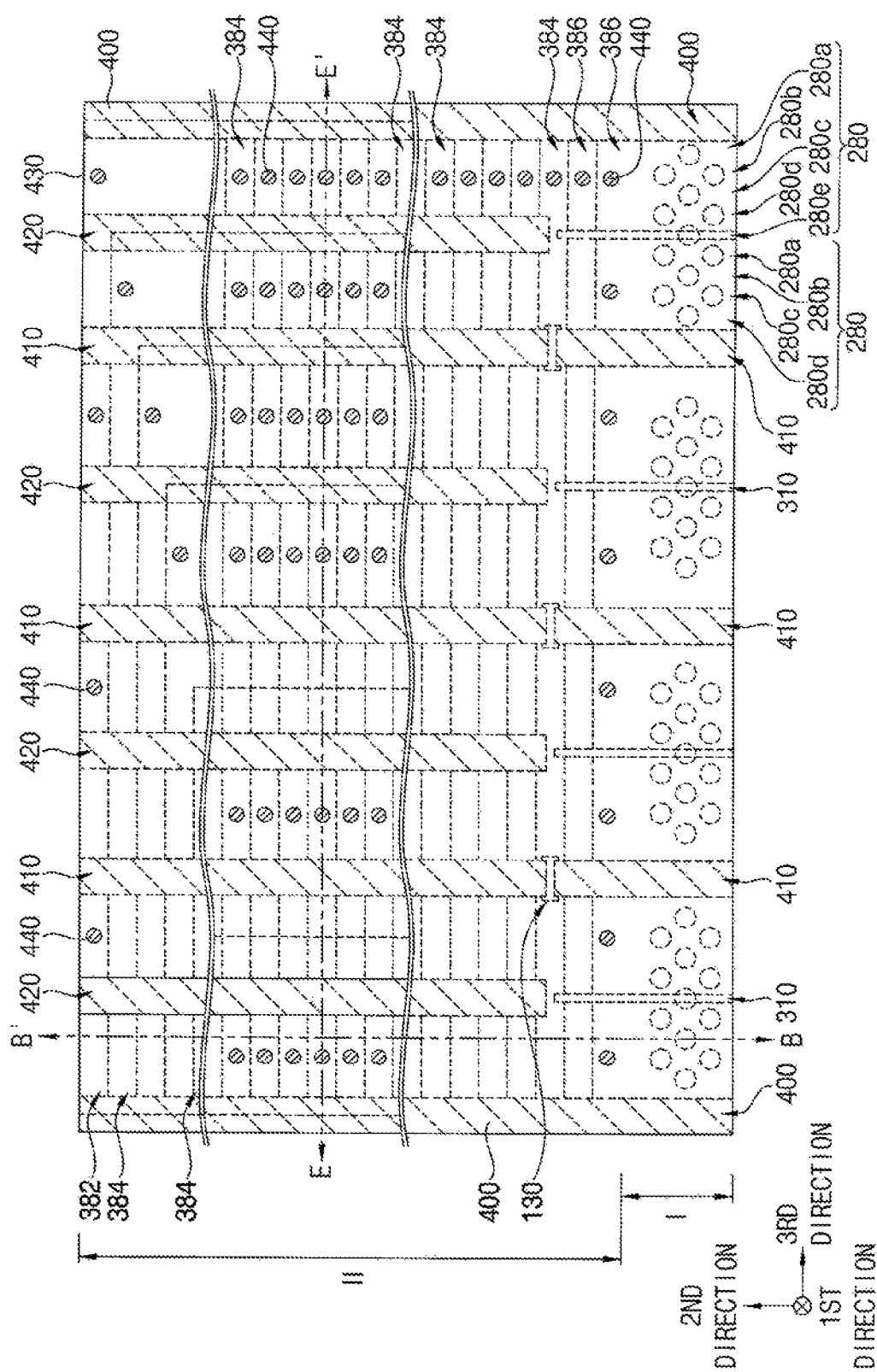
Figure 40:
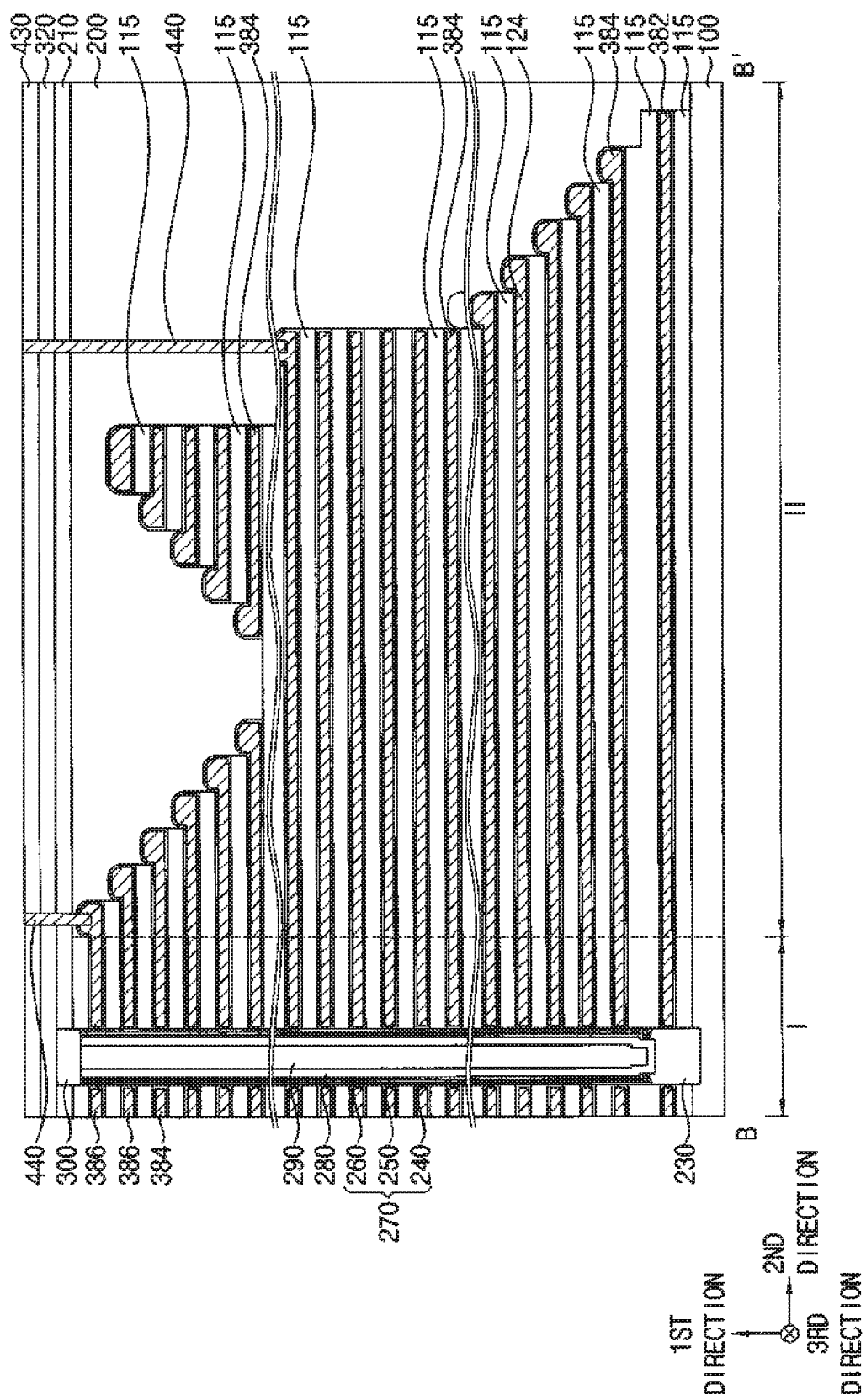
Figure 41:
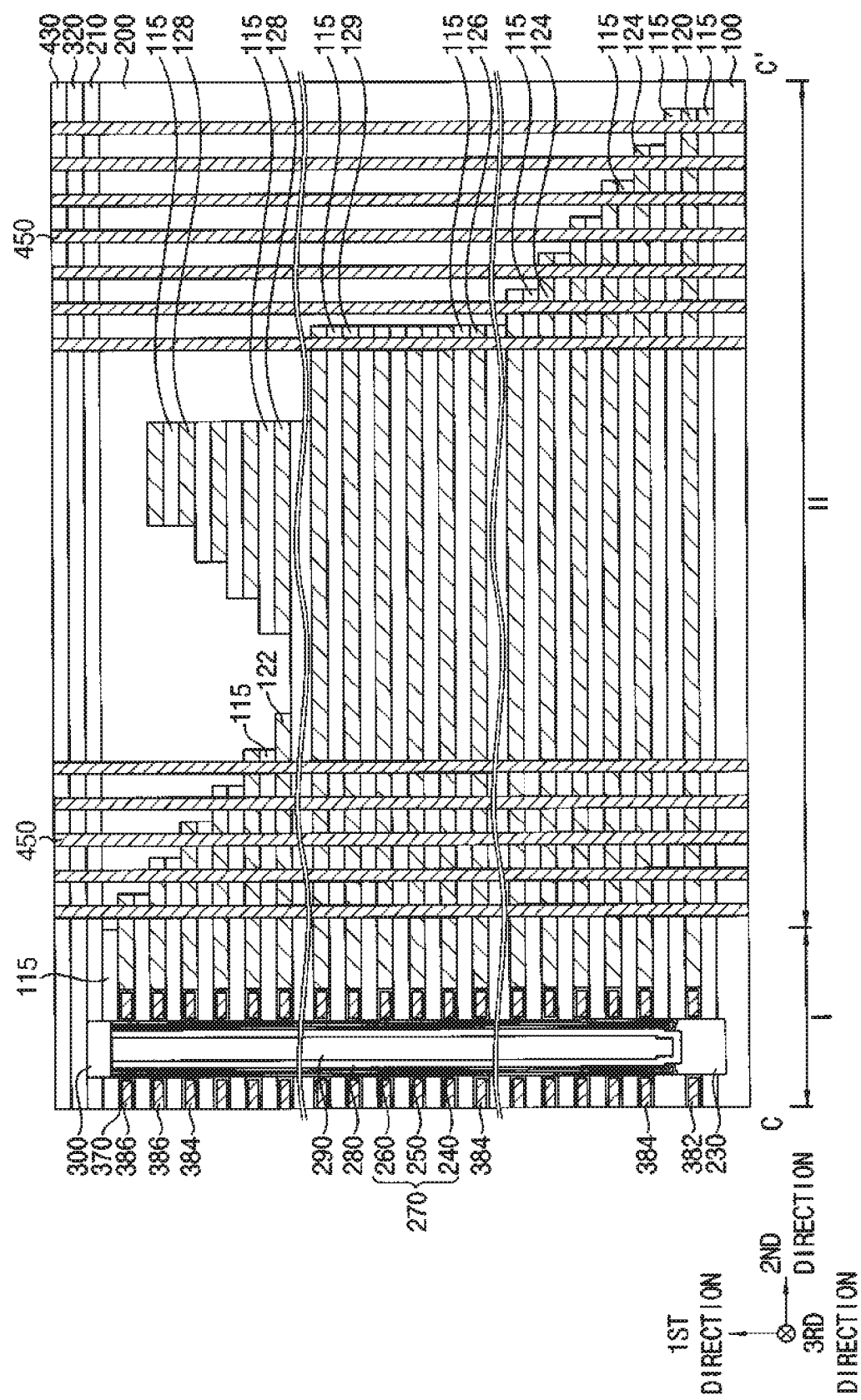
Figure 43:
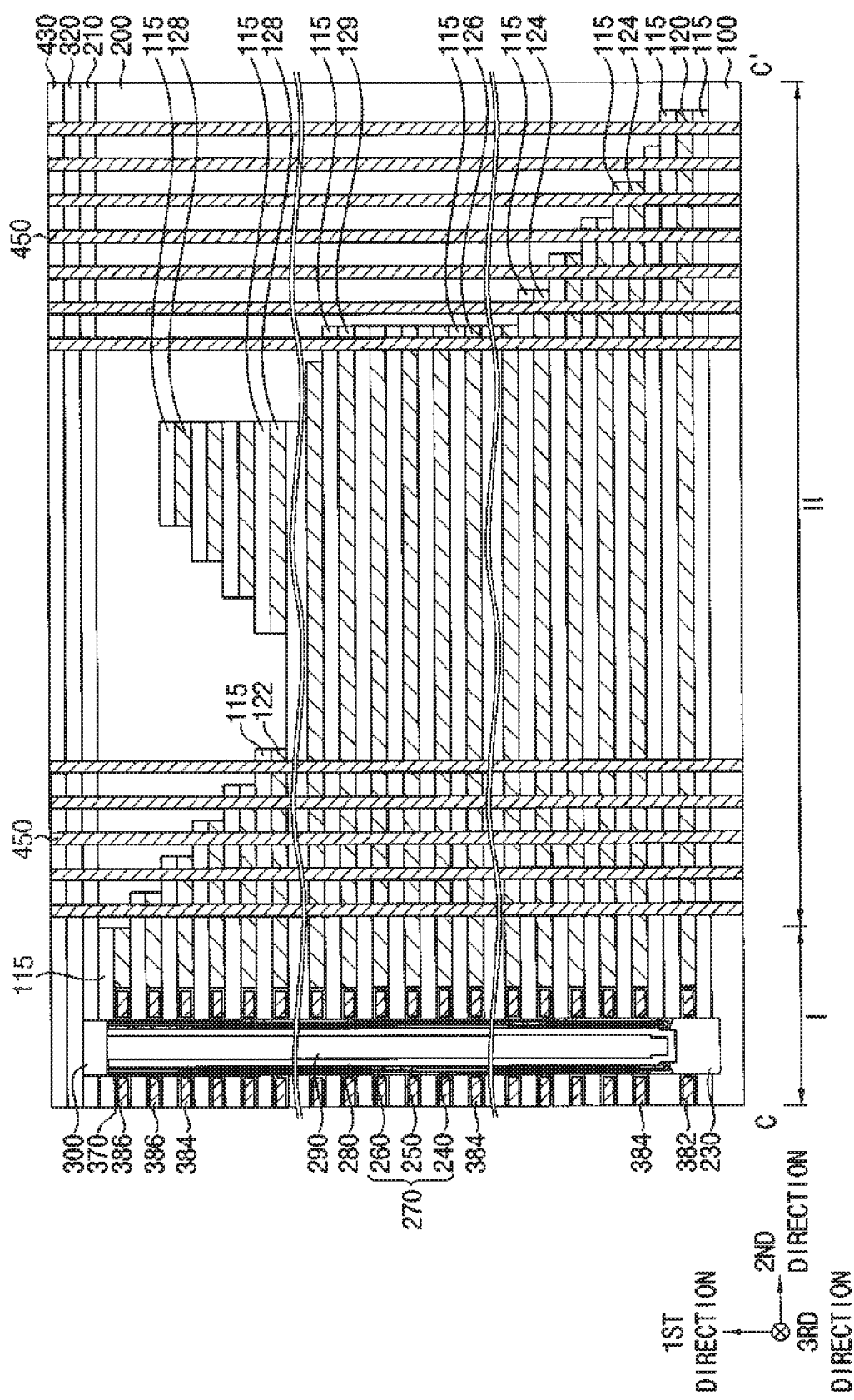
FIGS. 43 and 44 are cross-sectional views illustrating a vertical memory device in accordance with exemplary embodiments of the present inventive concept.
Figure 44:
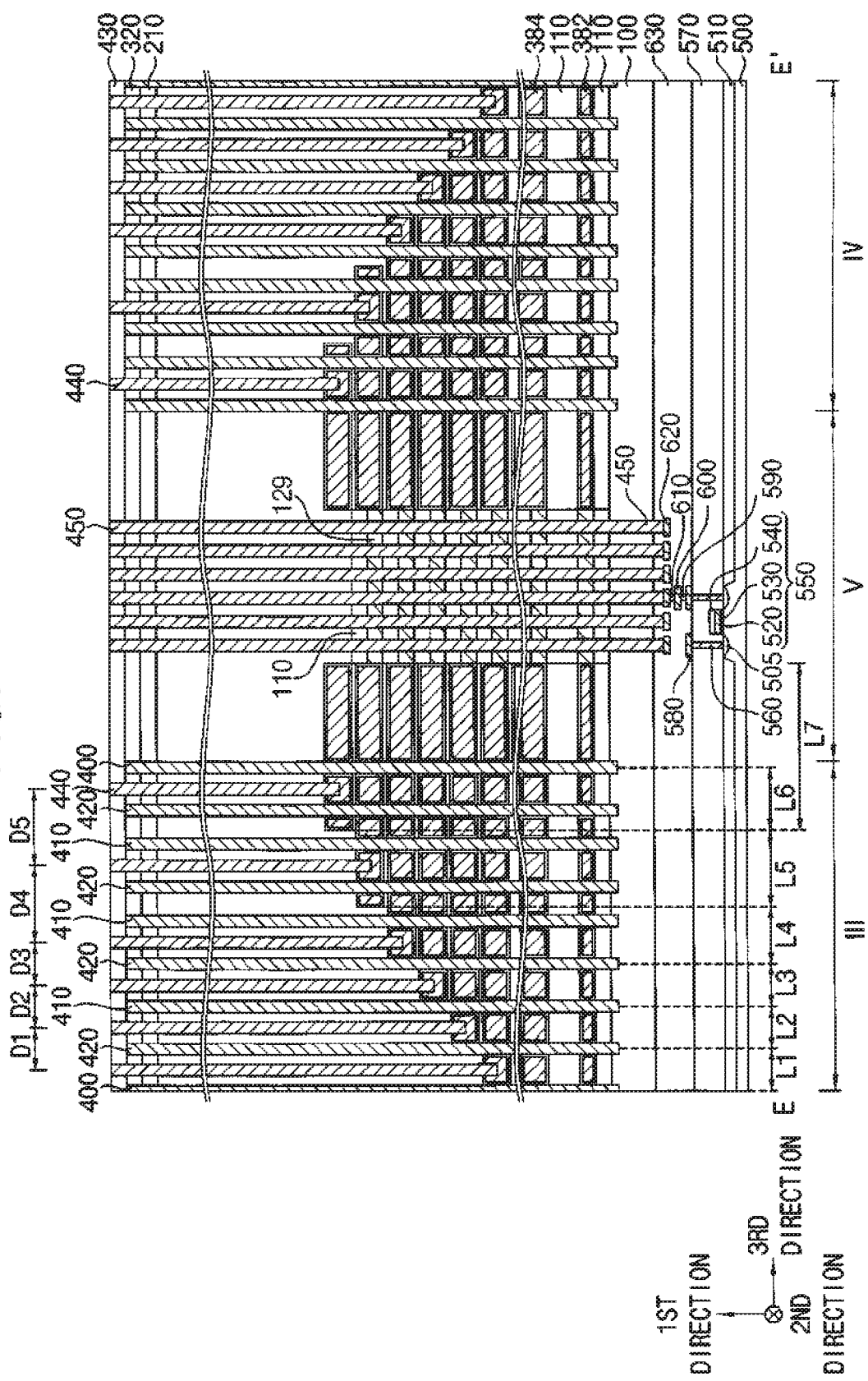

FIGS. 43 and 44 are cross-sectional views illustrating a vertical memory device in accordance with exemplary embodiments of the present inventive concept. FIG. 43 is a cross-sectional view taken along a line C-C' of FIG. 39, and FIG. 44 is a cross-sectional view taken along a line E-E' of FIG. 39. This vertical memory device may be substantially the same as that of FIGS. 39 to 42, except for the fifth region of the substrate. Thus, like reference numerals may refer to like elements, and to the extent that details are omitted, they may be assumed to be at least similar to details of corresponding elements that have already been described.

Referring to FIGS. 43 and 44, the mold between the seventh and eighth stair structures might not include the fifth sacrificial pattern 129 corresponding to the sixth and twelfth steps, which may be implemented by entirely removing the steps at the uppermost level in each of the stair structures in the process illustrated with reference to FIG. 27.

FIG. 45 is a cross-sectional view taken along a line E-E' of FIG. 39 illustrating a vertical memory device in accordance with exemplary embodiments of the present inventive concept. FIG. 45 is a schematic drawing illustrating the connection between the contact plug 440 and the through via 450 in the vertical memory device illustrated with reference to FIGS. 39 to 42.

Referring to FIG. 45, one or more of the through vias 450 may be electrically connected to one or more of the contact plugs 440 on the steps of the seventh stair structure, and one or more of the through vias 450 may be electrically connected to one or more of the contact plugs 440 on the steps of the eighth stair structure. In the figure, three through vias 450 are electrically connected to three contact plugs 440, respectively, on the steps of the seventh stair structure, and three through vias 450 are electrically connected to three contact plugs 440, respectively, on the steps of the eighth stair structure, however, the inventive concepts is not limited thereto.

The through vias 450 and the contact plugs 440 may be electrically connected to each other by upper wirings 480 at the same level.

While exemplary embodiments of the present inventive concept have been particularly shown and described, it will be understood by one of ordinary skill in the art that variations in form and detail may be made therein without departing from the spirit and scope of the claims.

What is claimed is:

1. A vertical memory device, comprising:
a substrate including a cell array region and a staircase region at least partially surrounding the cell array region;
a plurality of gate electrodes spaced apart from each other in each of first and third directions within the cell array region and the staircase region of the substrate, wherein each of the plurality of gate electrodes extends in a second direction, wherein the first direction is substantially perpendicular to an upper surface of the substrate, wherein the third direction is substantially parallel to the upper surface of the substrate, and wherein the second direction is substantially parallel to the upper surface of the substrate and crosses the third direction; and
a channel extending in the first direction within the cell array region of the substrate, wherein the channel extends through at least one of the plurality of gate electrodes,
wherein end portions in the second direction of the plurality of gate electrodes form a first stair structure on the staircase region of the substrate,
wherein the first stair structure includes a plurality of first steps, a second step, and a third step, sequentially disposed in the third direction, and
wherein each of the plurality of first steps has a first length in the third direction, wherein the second step has a second length in the third direction that is greater than the first length, and wherein the third step has a third length in the third direction that is greater than the second length.

2. The vertical memory device of claim 1, wherein each of the plurality of first steps, the second step, and the third step are sequentially arranged in the first direction from a lowermost level toward an uppermost level.

3. The vertical memory device of claim 1, wherein the first stair structure includes the plurality of first steps, the second step, the third step, and a fourth step, sequentially arranged in the third direction, and
wherein a fourth length of the fourth step in the third direction is greater than the third length.

4. The vertical memory device of claim 1, wherein the first stair structure includes three first steps.

5. The vertical memory device of claim 4, wherein a plurality of first stair structures, including the first stair structure, is disposed in the second direction at different levels, respectively.

6. The vertical memory device of claim 1, further comprising first, second and third contact plugs disposed on upper surfaces of the first, second and third steps, respectively.

7. The vertical memory device of claim 6, wherein a distance between the second and third contact plugs in the third direction is greater than a distance between the first contact plugs in the third direction.

8. The vertical memory device of claim 7, wherein a distance between the second contact plug and one of the first contact plugs adjacent thereto is substantially the same as the distance between the first contact plugs.

9. The vertical memory device of chili 1, further comprising a mold disposed adjacent to the first stair structure in the third direction, the mold contacting a sidewall of the first stair structure.

10. The vertical memory device of claim 9, wherein the mold includes first and second insulation patterns alternately and repeatedly stacked in the first direction.

11. The vertical memory device of claim 10, wherein each of the first insulation patterns includes a nitride and has a lower surface that is substantially coplanar with a lower surface of a corresponding element of the first to third steps.

12. The vertical memory device of claim 11, wherein an upper surface of each of the first insulation patterns is lower than an upper surface of the corresponding element of the first to third steps.

13. The vertical memory device of claim 9, further comprising a second stair structure, wherein the first and second stair structures are symmetric with respect to the mold in the third direction.

14. The vertical memory device of claim 9, further comprising a base pattern disposed on the substrate,
wherein the plurality of gate electrodes, the channel, and the mold are formed on the base pattern.

15. The vertical memory device of claim 14, further comprising:
a circuit pattern disposed between the substrate and the base pattern; and
a through via extending through the mold and the base pattern to be electrically connected to the circuit pattern.

16. A vertical memory device, comprising:
a substrate including a cell array region and a staircase region at least partially surrounding the cell array region;
a plurality of gate electrodes spaced apart from each other in each of first and third directions within the cell array region and the staircase region of the substrate, wherein each of the plurality of gate electrodes extends in a second direction, wherein the first direction is substantially perpendicular to an upper surface of the substrate, wherein the third direction is substantially parallel to the upper surface of the substrate, and wherein the second direction is substantially parallel to the upper surface of the substrate and crosses the third direction; and
a channel extending in the first direction within the cell array region of the substrate, wherein the channel extends through at least one of the plurality of gate electrodes,
wherein end portions in the second direction of the plurality of gate electrodes form first and second stair structures on the staircase region of the substrate, wherein each of the first and second stair structures has steps, and wherein the first and second stair structures are symmetric with each other in the third direction,
wherein a mold is disposed between the first and second stair structures, wherein the mold contacts sidewalls of the first and second stair structures and includes an insulating material, and
wherein the mold includes first and second insulation patterns alternately and repeatedly stacked in the first direction.

17. The vertical memory device of claim 16, wherein the mold extends in the second direction on the staircase region of the substrate and contacts sidewalls of the plurality of gate electrodes in the second direction.

18. The vertical memory device of claim 16,
wherein each of the first insulation patterns has a lower surface that is substantially coplanar with a lower surface of a corresponding gate electrode of the plurality of gate electrodes, in the second direction, and substantially coplanar with a lower surface of a corresponding step of the steps, in the third direction.

19. A vertical memory device, comprising:
a substrate including a cell array region and a staircase region at least partially surrounding the cell array region;
a plurality of gate electrodes spaced apart from each other in each of first and third directions within the cell array region and the staircase region of the substrate, wherein each of the plurality of gate electrodes extends in a second direction, wherein the first direction is substantially perpendicular to an upper surface of the substrate, wherein the third direction is substantially parallel to the upper surface of the substrate, and wherein the second direction is substantially parallel to the upper surface of the substrate and crosses the third direction; and
a channel extending in the first direction within the cell array region of the substrate, wherein the channel extends through at least one of the plurality of gate electrodes,
wherein end portions in the second direction of the plurality of gate electrodes form a stair structure on the staircase region of the substrate,
wherein the stair structure includes first to sixth step layers sequentially stacked in the first direction, wherein the first to sixth step layers have lengths in the third direction gradually decreasing from a lowermost one toward an uppermost one thereof, and
wherein each of the first and second step layers includes end portions of four gate electrodes, of the plurality of gate electrodes, disposed in the third direction, wherein each of the third and fourth step layers includes end portions of three gate electrodes, of the plurality of gate electrodes, disposed in the third direction, wherein the fifth step layer includes end portions of two gate electrodes, of the plurality of gate electrodes, disposed in the third direction, and wherein the sixth step layer includes an end portion of one gate electrode of the plurality of gate electrodes.

20. The vertical memory device of claim 19, wherein the first to sixth step layers include first to sixth steps, respectively, not covered by upper step layers, and
wherein at least one of the first to sixth step layers has a length in the third direction that is different from those of other ones of the first to sixth step layers.

* * * * *